(12) United States Patent
Iida

(10) Patent No.: US 7,535,288 B2
(45) Date of Patent: May 19, 2009

(54) CHARGE DOMAIN FILTER DEVICE

(75) Inventor: Sachio Iida, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/769,594

(22) Filed: Jun. 27, 2007

(65) Prior Publication Data

US 2008/0007326 A1 Jan. 10, 2008

(30) Foreign Application Priority Data

Jul. 6, 2006 (JP) ............................ P2006-187057

(51) Int. Cl.
 *H03K 5/00* (2006.01)
(52) U.S. Cl. ..................................... 327/554
(58) Field of Classification Search .......... 327/551–559
 See application file for complete search history.

(56) References Cited

U.S. PATENT DOCUMENTS

| 5,936,461 | A  | * | 8/1999  | Nagazumi ................. 327/552 |
| 6,556,073 | B2 |   | 4/2003  | Morie et al. |
| 6,606,049 | B1 | * | 8/2003  | Marble ..................... 341/155 |
| 6,829,311 | B1 | * | 12/2004 | Riley ....................... 375/326 |
| 6,856,925 | B2 |   | 2/2005  | Muhammad et al. |
| 7,103,489 | B2 |   | 9/2006  | Muhammad et al. |
| 2003/0006834 | A1 | | 1/2003 | Morie et al. |
| 2003/0083852 | A1 | | 5/2003 | Muhammad et al. |
| 2005/0025268 | A1 | | 2/2005 | Muhammad et al. |
| 2005/0025269 | A1 | | 2/2005 | Muhammad et al. |
| 2005/0025270 | A1 | | 2/2005 | Muhammad et al. |
| 2005/0233725 | A1 | | 10/2005 | Muhammad et al. |

OTHER PUBLICATIONS

Bagheri R R. et al., "An 800MHz to 5GHz Software-Defined Radio Receiver in 90 nm CMOS", Solid-State Circuits, 2006 IEEE International Conference Digest of Technical Papers Feb. 6-9, 2006, pp. 1932-1941.
Karvonen S. et al., "Charge-Domain FIR Sampler with Programmable Filtering Coefficients" Circuits and Systems, 2005. ISCAS 2005, IEEE International Symposium on Kobe, Japan May 23-26, 2005, pp. 4425-4428.
Muhammad K. et al., "Direct RF Sampling Mixer with Recursive Filtering in Charge Domain", Circuits and Systems, 2004, ISCAS '04. Proceedings of the 2004 International Symposium on Vancouver, BC, Canada May 23-26, 2004, pp. 1-577.
L. Richard Carley et al., "High-Speed Lo-PowerIntegrating CMOS Sample-and-Hold Amplifier Architecture", Proceedins of IEEE 1995 Custom Integrated Circuits Conference, pp. 543-546, May 1995.

(Continued)

*Primary Examiner*—Dinh T. Le
(74) *Attorney, Agent, or Firm*—Finnegan, Henderson, Farabow, Garrett & Dunner, L.L.P.

(57) ABSTRACT

There is provided a charge domain filter device including a plurality of transconductors each of which converts an input voltage to a current and outputs the current and a filter unit that filters output signals from said plurality of transconductors by repeatedly charging and discharging a plurality of capacitors, wherein an impulse response of the charge domain filter device is obtained through convolution of a first impulse corresponding to a charge time length over which said capacitors are charged and a second impulse corresponding to each of said plurality of transconductors.

7 Claims, 19 Drawing Sheets

OTHER PUBLICATIONS

J. Yuan, "A Charge Sampling Mixer with Embedded Filter Function for Wireless Applications", Proceedings of IEEE 2000 International Conference on Microwave and Millimeter Wave Technology, pp. 315-318, Sep. 2000.

A. Mirzaie et al., "A Second-Order Anti-Aliasing Prefilter for an SDR Receiver", Proceedings of IEEE 2005, Custom Integrated Circuits Conference, pp. 629-632, Sep. 2005.

* cited by examiner

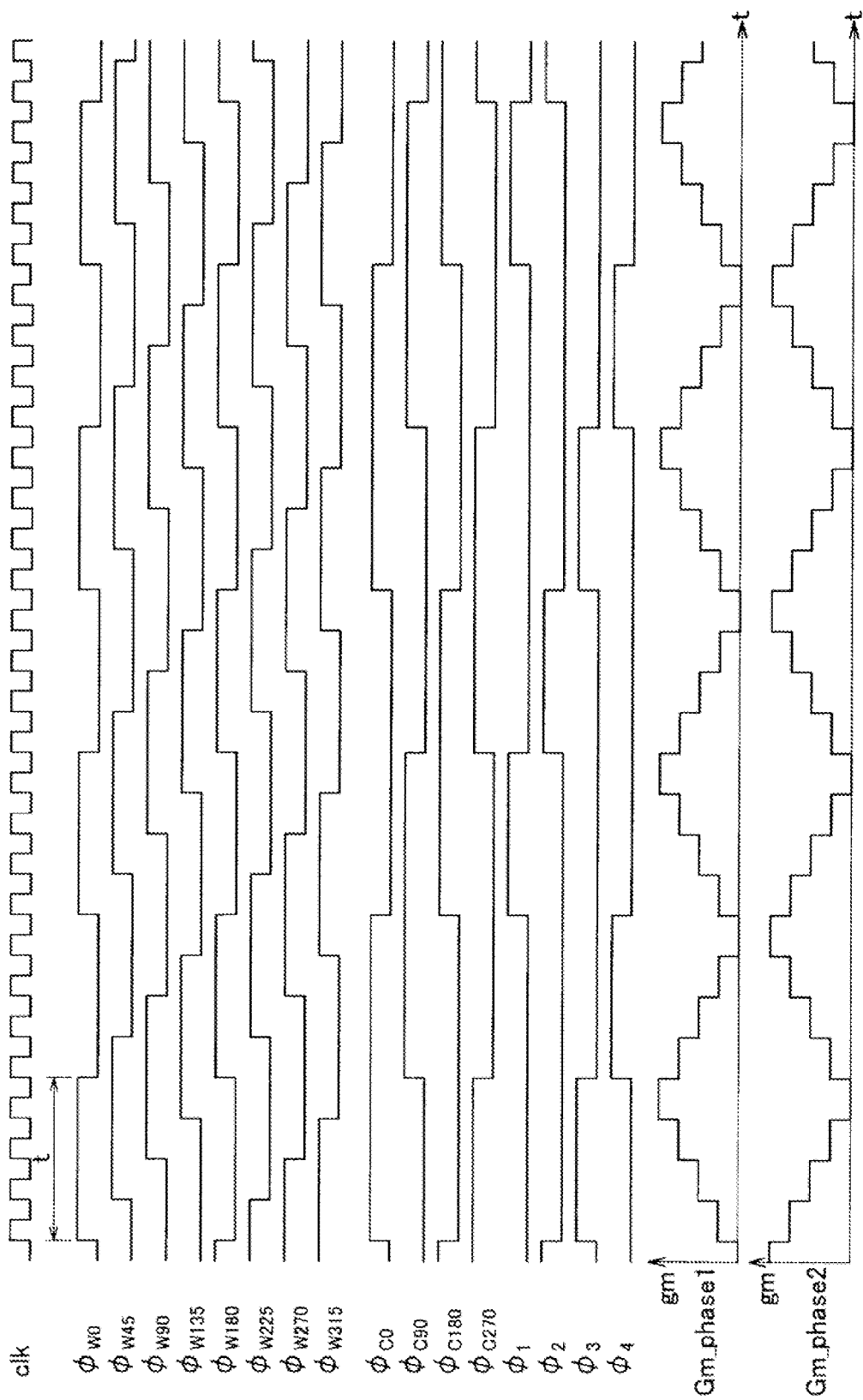

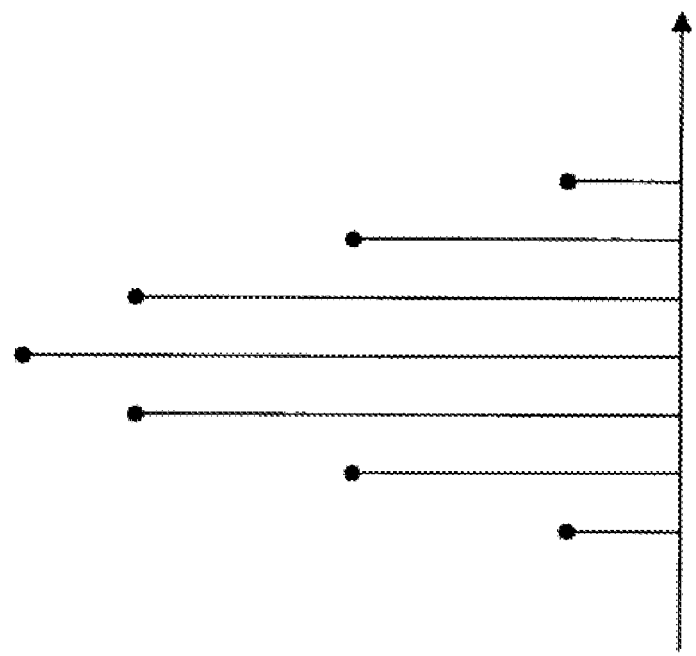
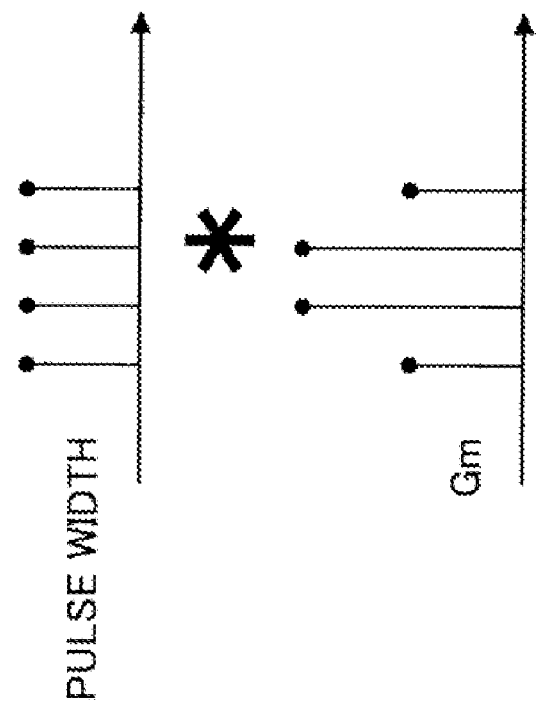

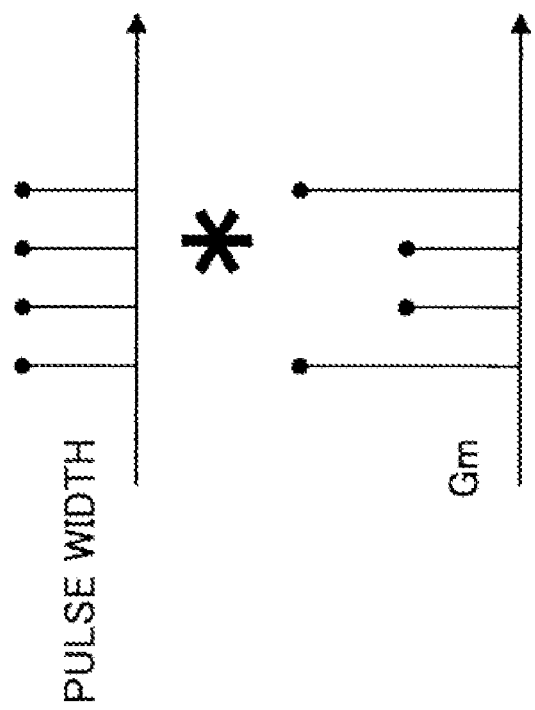
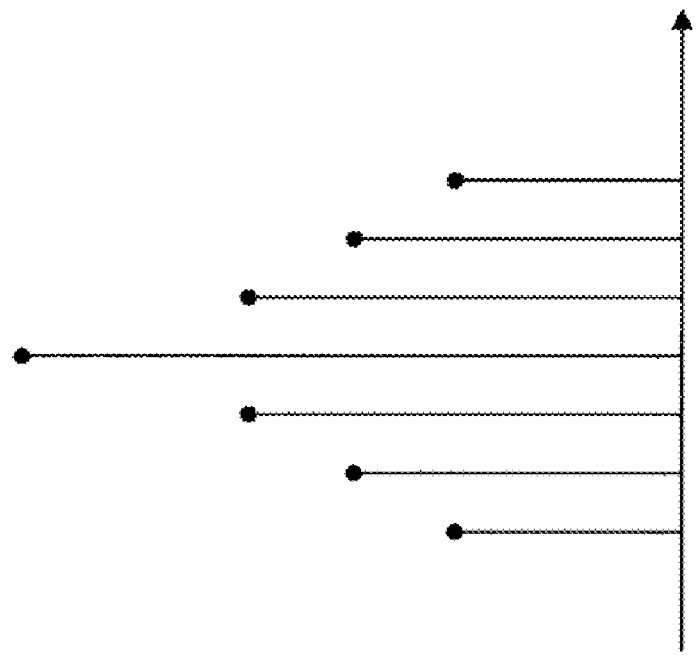

CHARGE DOMAIN FILTER DEVICE

CROSS REFERENCE TO RELATED APPLICATION

The present invention contains subject matter related to Japanese Patent Application No. JP 2006-187057 filed in the Japan Patent Office on Jul. 6, 2006, the entire contents of which being incorporated herein by reference.

BACKGROUND OF THE INVENTION

1. Field of the Invention

The present invention relates to a filter device designed by charge domain operations (hereinafter, called a charge domain filter device).

2. Description of the Related Art

An SoC (system-on-chip) used in wireless communication, which is achieved by embedding an RF (radio frequency: high frequency) circuit and a digital circuit in a single CMOS (complementary metal oxide semiconductor) circuit chip, needs to allow the RF circuit to be provided as a compact unit and assure better energy efficiency in the RF circuit. In order to respond to these needs, the development of filtering and decimation technologies achieved through adoption of analog discrete-time signal processing technologies such as current mode sampling with a high-speed clock and switched capacitor circuits as disclosed in non-patent Reference Literature 1, is being actively pursued.

In addition, a charge domain filter circuit that includes only a transconductor and a switch to form a SINC filter circuit, the frequency characteristics of which assume SINC function characteristics without utilizing an operational amplifier, has been proposed as disclosed in Nonpatent Reference Literature 2 or Nonpatent Reference Literature 3. Since the filter in such a charge domain filter circuit is constituted with a transconductor and a switch alone, an RF signal in the GHz band can be directly sampled or filtered with the charge domain filter circuit. The following is a description of a charge domain filter circuit forming a SINC filter circuit.

FIG. 17 shows the structure adopted in a charge domain filter circuit forming a SINC filter circuit in the related art. As shown in FIG. 17, a charge domain filter circuit 10 forming a SINC filter circuit, proposed in the related art, includes a transconductor 12, a first switch 14, a second switch 16, a third switch 18, and capacitors 20a, 20b, 20c and 20d.

FIG. 18 presents a timing chart of the clock signals applied to the charge domain filter circuit 10 shown in FIG. 17. Four clock signals Ø1, Ø2, Ø3 and Ø4 in FIG. 18, in different phases, are used to control the operations of the first switch 14, the second switch 16 and the third switch 18 in the charge domain filter circuit 10.

The transconductor 12 outputs a current in proportion to the voltage of an input signal.

A specific capacitor to be charged by applying the current output from the transconductor 12 is selected via the first switch 14. In the charge domain filter circuit 10 shown in FIG. 17, the first switch 14 is switched to a specific terminal based upon the four types of clock signals Ø1, Ø2, Ø3 and Ø4 and the capacitor corresponding to the selected terminal is charged.

A specific capacitor to be initialized by purging the residual charge is selected via the second switch 16. The second switch 16 is switched to a specific terminal based upon the four types of clock signals Ø1, Ø2, Ø3 and Ø4 in the charge domain filter circuit 10 in FIG. 17. The capacitor corresponding to the terminal selected at the second switch 16 is grounded and initialized by purging the residual electrical charge so as to purge the capacitor of any residual charge attributable to a previous signal.

A specific capacitor holding an electrical charge stored therein to be output to a circuit at a rear stage is selected via the third switch 18. The third switch 18 is switched to a specific terminal based upon the four types of clock signals Ø1, Ø2, Ø3 and Ø4 and as the specific terminal is selected, the electrical charge stored at the corresponding capacitor is output to the circuit at the rear stage in the charge domain filter circuit 10 shown in FIG. 17.

The terminals Ø1, Ø2, Ø3 and Ø4 at each of the switches, i.e., the first switch 14, the second switch 16 and the third switch 18, become connected when the corresponding clock signals Ø1, Ø2, Ø3 and Ø4 enter the ON state.

The current output from the transconductor 12, which is in proportion to the voltage of the input signal, is applied over the time length t to one of the capacitors, selected via the first switch 14, is integrated at the capacitor over the time length t, and is stored as an electrical charge. Then, the charge stored at the selected capacitor is output to the circuit at the rear stage for sampling. For instance, as the first switch 14 is controlled with the clock signal Ø1 and the first capacitor 20a is charged with the current output from the transconductor 12, the third switch 18 is controlled with the clock signal Ø2 to output the stored electrical charge to the circuit at the rear stage. Subsequently, the second switch is controlled with the clock signal Ø4 to ground the first capacitor 20a and, as a result, the residual charge is released and the first capacitor becomes initialized.

The capacitors 20a, 20b, 20c and 20d are each repeatedly engaged in sampling operations over time intervals t in response to the operations of the first switch 14, the second switch 16 and the third switch 18. Thus, the input signal is sampled with a rectangular time window t and since a notch occurs at a position corresponding to an integral multiple of 1/t due to the frequency characteristics, the charge domain filter circuit 10 is able to function as a SINC filter. For instance, assuming that t=1 ns, a notch occurs at 1 GHz (i.e., at a position corresponding to an integral multiple of 1/t) and the charge domain filter circuit 10 is able to function as a SINC filter achieving frequency characteristics such as those shown in FIG. 19.

(Nonpatent Reference Literature 1) L. Richard Carley and Tamal Mukherjee, "High-Speed Low-Power Integrating CMOS Sample-and-Hold Amplifier Architecture," Proceedings of IEEE 1995 Custom Integrated Circuits Conference, pp 543~546, May 1995

(Nonpatent Reference Literature 2) J. Yuan, "A Charge Sampling Mixer With Embedded Filter Function for Wireless Applications" proceedings of IEEE 2000 International Conference on Microwave and Millimeter Wave Technology, pp 315~318, September 2000

(Nonpatent Reference Literature 3) A. Mirzaie, R. Bagheri, S. Cherazi and A. A. Abidi "A Second-Order Antialiasing Prefilter for an SDR Receiver", Proceedings of IEEE 2005 Custom Integrated Circuits Conference, pp 629~632, September 2005

SUMMARY OF THE INVENTION

However, the charge domain SINC filter circuits in the related art fail to achieve superior characteristics as low pass filters. For instance, assuming that the sampling cycle t of the SINC filter circuit in the related art shown in FIG. 17 is 1 ns, a concern arises in that the second lobe over a frequency range of 1/t~1/2t, i.e., over a range of 1 GHz~2 GHz, may be as large as −13 dB.

Higher-order filtering is difficult to be achieved without altering the sampling rate in a charge domain filter circuit. While the low-range component characteristics are improved in the method disclosed in Nonpatent Reference literature 3 with the frequency characteristics raised to the second power of the SINC, its application range is still very limited since, unlike an FIR (finite impulse response) filter, it does not allow the frequency characteristics to be adjusted freely.

This means that a reconfigurable RF circuit cannot be designed and thus, if a plurality of wireless communication services with varying mean frequencies or varying bandwidths are to be used at a single terminal, the terminal will need to be equipped with filter circuits in a quantity matching the number of services to be subscribed to. This, in turn, poses a difficulty in scaling back the RF circuit and ultimately results in the overall device assuming a large scale configuration.

Accordingly, the present invention, which has been completed by addressing the issues discussed above, provides a new and improved charge domain filter circuit that is able to efficiently pass a low-range component and, at the same time, allows the frequency characteristics thereof to be adjusted freely.

According to an embodiment of the present invention, there is provided a charge domain filter device. The charge domain filter device includes a plurality of transconductors each of which converts an input voltage to a current and outputs the current a filter unit that filters output signals from the plurality of transconductors by repeatedly charging and discharging a plurality of capacitors. The charge domain filter device is characterized in that the charge domain filter device having an impulse response is obtained therein through convolution of a first impulse corresponding to the capacitor charge time length and a second impulse corresponding to each of the plurality of transconductors and that the first impulse is weighted.

In the charge domain filter device adopting the structure described above, the input voltage is converted to a current value at each of the plurality of transconductors and the output signals from the transconductors are filtered at the filter unit. Since the impulse response of the charge domain filter device is obtained through convolution of the first impulse and the second impulse, the frequency characteristics can be adjusted freely by altering the charge time length and the weight applied to the transconductance.

A signal obtained through convolution of the first impulse with the second impulse may be input to the filter unit, and such convolution may be achieved by slicing out the output currents from the plurality of transconductors with a plurality of rectangular windows assuming varying phases and then calculating the sum of the output currents. In this case, the impulse response corresponding to a specific weight applied to the transconductance is achieved by slicing out the output currents from the plurality of transconductors with the plurality of rectangular windows assuming varying phases and then calculating their sum. As a result, since the impulse response corresponding to the weight applied to the transconductance, achieved by calculating the sum of the output currents from the transconductors, can be varied, the frequency characteristics of the charge domain filter device can be adjusted.

The convolution may be achieved by adding up the electrical charges at the capacitors sampled by the filter unit at varying phases. In such a structure, the impulse response corresponding to the charge time length can be achieved by calculating the sum of electrical charges sampled at different phases. As a result, since the impulse response corresponding to the charge time length, achieved by calculating the sum of the charges sampled at different phases, can be varied, the frequency characteristics of the charge domain filter device can be adjusted.

The charge domain filter device may further include a switch unit disposed between the plurality of transconductors and the filter unit. The switch unit in such a charge domain filter device opens/closes a switch thereof with predetermined timing so as to control application of the output currents from the plurality of transconductors to the filter unit. Consequently, the charge domain filter device achieved in an embodiment of the present invention can be engaged in band pass charge sampling whereby signals are filtered over a specific bandwidth According to the embodiments of the present invention described above, a new and improved charge domain filter device, capable of efficiently passing the low-range component, which also allows the frequency characteristics thereof to be adjusted freely, can be provided.

BRIEF DESCRIPTION OF THE DRAWINGS

FIG. 2 is a chart of clock signals input to the charge domain filter circuit in the first embodiment of the present invention;

FIG. 5 shows how an impulse response that may be obtained in the charge domain filter circuit in the first embodiment of the present invention;

FIG. 12 shows yet another example of impulse response;

DETAILED DESCRIPTION OF THE PREFERRED EMBODIMENTS

Figure 1:
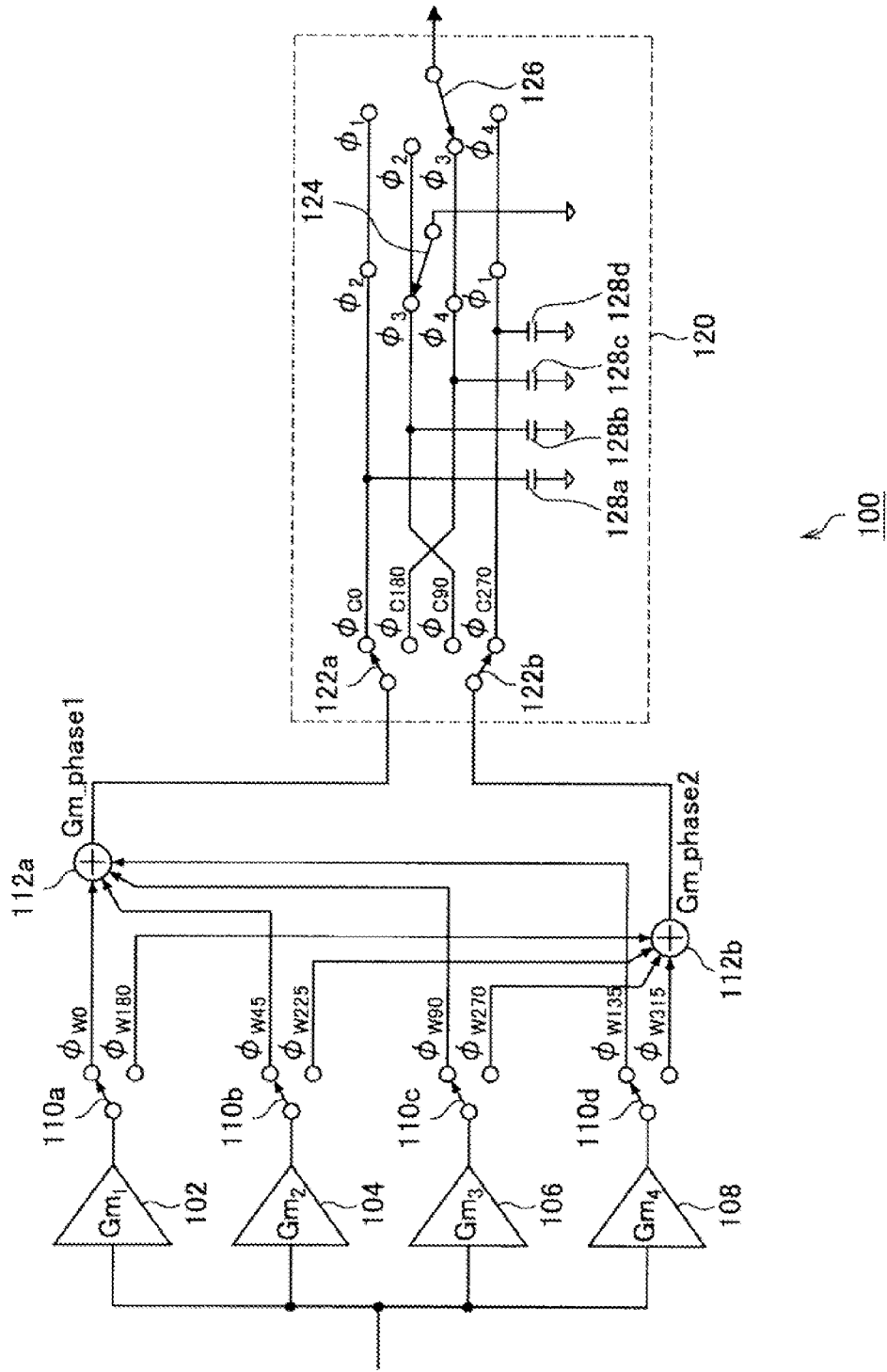
FIG. 1 shows the charge domain filter circuit achieved in a first embodiment of the present invention.

Hereinafter, a preferred embodiment of the present invention will be described in detail with reference to the appended drawings. Note that, in this specification and the appended drawings, structural elements that have substantially the same function and structure are denoted with the same reference numerals, and repeated explanation of these structural elements is omitted.

First Embodiment

First, the charge domain filter circuit achieved in the first embodiment of the present invention is described.

FIG. 1 shows the charge domain filter circuit achieved in the first embodiment of the present invention. As shown in FIG. 1, the charge domain filter circuit 100 in the first embodiment of the present invention includes transconductors 102, 104, 106 and 108, switches 110a, 110b, 110c and 110d, adders 112a and 112b and a SINC filter circuit 120.

The SINC filter circuit 120 includes first switches 122a and 122b, a second switch 124, a third switch 126 and capacitors 128a, 128b, 128c and 128d.

The transconductors 102, 104, 106 and 108 each output a current in proportion to the voltage of an input signal. While four transconductors are used to constitute the charge domain filter circuit in the embodiment, the number of transconductors in a charge domain filter circuit embodying the present invention is not limited to four. In addition, the transconductors may assume transconductance values equal to one another or they may assume transconductance values different from one another. The following explanation is provided by assuming that the four transconductors all assume transconductance values equal to one another.

Via the switches 110a, 110b, 110c and 110d, the adder to which the output from a given transconductor is to be input is selected. At the switches 110a, 110b, 110c and 110d, terminals are selected at using clock signals in different phases. While terminal changeovers at the individual switches are achieved by using eight types of clock signals with varying phases in the embodiment, the present invention may be adopted in conjunction with a different number of switches.

The adders 112a and 112b each calculate the sum of the outputs from the transconductors and output the sum. The specific transconductors, the outputs of which are to be added together, are selected via the switches 110a, 110b, 110c and 110d.

The SINC filter circuit 120 filters a signal input thereto and provides the filtered output. The SINC filter circuit 120 executes the filtering operation by using two input signals.

The first switches 122a and 122b are each used to select a capacitor to be charged. Either the capacitor 128a or the capacitor 128c is selected via the first switch 122a, whereas either the capacitor 128b or the capacitor 128d is selected via the first switch 122b. At the first switches 122a and 122b are switched to specific terminals based upon four types of clock signals with varying phases.

A specific capacitor to undergo initialization is selected via the second switch 124. The specific capacitor in the SINC filter circuit 120 to be initialized so as to purge the residual charge therein is selected through the second switch 124. The second switch 124 is switched to a specified terminal based upon four types of clock signals in the charge domain filter circuit 100 in the first embodiment of the present invention. As the second switch 124 is connected to a given terminal, the capacitor connected to the selected terminal is initialized so as to purge the capacitor of any residual charge attributable to a previous signal.

A specific capacitor holding an electrical charge to be output to a circuit at a rear stage is selected via the third switch 126. One of the capacitors in the SINC filter circuit 120, the electrical charge of which, having been stored therein, is to be output to the circuit at the rear stage, is selected through the third switch 126. The third switch is switched to connect with one of terminals based upon four types of clock signals and the electrical charge stored at the capacitor connected to the selected terminal is output to the circuit at the rear stage in the charge domain filter circuit 100 in the first embodiment of the present invention.

Electrical charges are stored at the capacitors 128a, 128b, 128c and 128d. The electrical charges are stored with currents output from the transconductors. It is desirable that the capacities of the capacitors 128a, 128b, 128c and 128d be equal to one another.

Next, the operations executed in the charge domain filter circuit in the first embodiment of the present invention, adopting the structure described above, are explained FIG. 2 presents a chart of the clock signals input to the charge domain filter circuit in the first embodiment of the present invention. As shown in FIG. 2, 16 types of clock signals are input to the charge domain filter circuit in the first embodiment of the present invention. The following is an explanation of the clock signals input to the charge domain filter circuit in the first embodiment of the present invention.

Clock signals $\varnothing_{W0}$, $\varnothing_{W45}$, $\varnothing_{W90}$, $\varnothing_{W135}$, $\varnothing_{W180}$, $\varnothing_{W225}$, $\varnothing_{W270}$ and $\varnothing_{W315}$ are input to the switches 110a, 110b, 110c and 110d. The clock signals $\varnothing_{W0}$ and $\varnothing_{W180}$ are input to the switch 110a, the clock signals $\varnothing_{W45}$ and $\varnothing_{W225}$ are input to the switch 110b, the clock signals $\varnothing_{W90}$ and $\varnothing_{W270}$ are input to the switch 110c and the clock signals $\varnothing_{W135}$ and $\varnothing_{W315}$ are input to the switch 110d.

The pairs of clock signals $\varnothing_{W0}$ and $\varnothing_{W180}$, clock signals $\varnothing_{45}$ and $\varnothing_{W225}$, clock signals $\varnothing_{W90}$ and $\varnothing_{W270}$, and clock signals $\varnothing_{W135}$ and $\varnothing_{W315}$ each maintain a specific ON/OFF relationship. Namely, while the clock signal $\varnothing_{W0}$ is in the ON state, the clock signal $\varnothing_{W180}$ sustains the OFF state. Likewise, while the clock signal $\varnothing_{45}$ is in the ON state, the clock signal $\varnothing_{W225}$ sustains the OFF state, while the clock signal $\varnothing_{W90}$ is in the ON state, the clock signal $\varnothing_{W270}$ sustains the OFF state and while the clock signal $\varnothing_{W135}$ is in the ON state, the clock signal $\varnothing_{W315}$ sustains the OFF state.

As two types of clock signals are input to each switch as described above, the terminals at the switch can be switched over from one to the other.

The clock signals are input to the charge domain filter circuit achieved in the first embodiment of the present intention as described above. Next, the operations executed at the various units of the charge domain filter circuit, in response to the clock signals input to the charge domain filter circuit, are explained.

The switch 110a connects with the terminal corresponding to the clock signal $\varnothing_{W0}$ as the clock signal $\varnothing_{W0}$ enters the ON state. Then, as the clock signal $\varnothing_{W0}$, having been in the ON state over a time length t, enters the OFF state and the clock signal $\varnothing_{W180}$ enters the ON state, the switch 110a connects with the terminal corresponding to the clock signal $\varnothing_{W180}$.

A specific terminal is selected at each of the other switches with two types of clock signals. Namely, the switch 110b connects with the terminal corresponding to the clock signal $\varnothing_{W45}$ as the clock signal $\varnothing_{W45}$ enters the ON state. Then, as the clock signal $\varnothing_{W45}$, having been in the ON state over a time length t, enters the OFF state and the clock signal $\varnothing_{W225}$ enters the ON state, the switch 110a connects with the terminal corresponding to the clock signal $\varnothing_{W225}$.

Likewise, the switch 110c connects with the terminal corresponding to the clock signal $\varnothing_{W90}$ as the clock signal $\varnothing_{W90}$ enters the ON state, whereas the switch 110d connects with the terminal corresponding to the clock signal $\varnothing_{W135}$ as the clock signal $\varnothing_{W135}$ enters the ON state. Then, as the clock signal $\varnothing_{W90}$, having been in the ON state over the time length t enters the OFF state and the clock signal $\varnothing_{W270}$ enters the ON state, the switch 110c connects with the terminal corresponding to the clock signal $\varnothing_{W270}$. Likewise, as the clock signal $\varnothing_{W135}$, having been in the ON state over the time length t enters the OFF state and the clock signal $\varnothing_{W135}$ enters the ON state, the switch 110d connects with the terminal corresponding to the clock signal $\varnothing_{W270}$.

The outputs from the switches 110a, 110b, 110c and 110d are input to either the adder 112a or the adder 112b. Namely, the signals to be added up our selected in correspondence to the ON/OFF state of the clock signals input to the individual switches.

For instance, if the clock signals $\varnothing_{W0}$, $\varnothing_{W45}$, $\varnothing_{W90}$ and $\varnothing_{W135}$ are in the ON state, the outputs from the four transconductors are all input to the adder 112a. If, on the other hand, the clock signals $\varnothing_{W0}$, $\varnothing_{45}$, $\varnothing_{W270}$ and $\varnothing_{W315}$ are in the ON state, the outputs from the transconductors 102 and 104 are input to the adder 112a and the outputs from the transconductors 106 and 108 are input to the adder 112b.

Gm_phase 1 in FIG. 2 indicates the relationship between the level of the signal output from the adder 112a and the time length, whereas Gm_phase 2 in FIG. 2 indicates the relationship between the level of the signal output from the adder 112b and the time length. As Gm_phase 1 and Gm_phase 2 indicate, the outputs from the adders 112a and 112b change in stages over time.

For instance, when the signals $\varnothing_{W0}$, $\varnothing_{W45}$, $\varnothing_{W90}$ and $\varnothing_{W135}$ are in the ON state, the outputs from the four transconductor are all input to the adder 112a and thus, Gm_phase 1 assumes the largest value. When the signals $\varnothing_{W0}$, $\varnothing_{W45}$, $\varnothing_{W270}$ and $\varnothing_{W315}$ are in the ON state, on the other hand, the outputs from the transconductors 102 and 104 are input to the adder 112a and the outputs from the transconductors 106 and 108 are input to the adder 112b, allowing Gm_phase 1 and Gm_phase 2 to assume values equal to each other.

By inputting the outputs from the adders 112a and 112b, which change over time, to the SINC filter circuit 120 with predetermined timing, the frequency characteristics of the SINC filter circuit can be improved. The inputs to the SINC filter circuit 120 are controlled via the first switches 122a and 122b by using clock signal $\varnothing_{C0}$, $\varnothing_{C90}$ $\varnothing_{C180}$ and $\varnothing_{C270}$. Clock signals $\varnothing_{C0}$ and $\varnothing_{C180}$ are used in correspondence to each other, whereas the clock signals $\varnothing_{C90}$, and $\varnothing_{C270}$ are used in correspondence to each other.

As the clock signal $\varnothing_{C0}$ shifts from the OFF state to the ON state, the first switch 122a is connected to the terminal corresponding to the clock signal $\varnothing_{C0}$. As a result the output from the adder 112a is input to the capacitor 128a and a electrical charge is stored at the capacitor 128a.

Since the output from the adder 112a changes in steps over time, the current input to the capacitor 128a also changes in steps over time.

The clock signal $\varnothing_{C0}$ having been in the ON state over a time length 2t then the shifts to the OFF state, and accordingly, the clock signal $\varnothing_{C180}$ enters the ON state. The output from the adder 112a is thus input to the capacitor 128c and an electrical charge is stored at the capacitor 128c. The current input to the capacitor 128c, too, changes in stages as does the current input to the capacitor 128a.

When the clock signal $\varnothing_{C180}$ has been held in the ON state over a time length 2t, the clock signal $\varnothing_{C180}$ shifts to the OFF state and the clock signal $\varnothing_{C0}$ enters the ON state. As the clock signal $\varnothing_{C0}$ and the clock signal $\varnothing_{C180}$ are alternately switched to the ON/OFF states over cycles 2t, as described above, the capacitor 128a and 128c are repeatedly charged.

As the clock signal $\varnothing_{C90}$ shifts from the OFF state to the ON state, the other first switch 122b is connected to the terminal corresponding to the clock signal $\varnothing_{C90}$. As a result, the output from the adder 112b is input to the capacitor 128b and an electrical charge is stored at the capacitor 128b. Since the output from the adder 112a, changes input steps over time, as does the output from the adder 112a, the current input to the capacitor 128b also changes in steps over time.

The clock signal $\varnothing_{C90}$ having been in the ON state over the time length 2t then the shifts to the OFF state, and accordingly, the clock signal $\varnothing_{C270}$ enters the ON state. The output from the adder 112b is thus input to the capacitor 128d and an electrical charge is stored at the capacitor 128d. The current input to the capacitor 128d, too, changes in stages as does the current input to the capacitor 128b.

The electrical charges having been stored at the capacitors 128a, 128b, 128c and 128d are output to the circuit at the rear stage via the third switch 126. The charge output timing is controlled by using four clock signals $\varnothing_1$, $\varnothing_2$, $\varnothing_3$ and $\varnothing_4$.

For instance, after the clock signal $\varnothing_{C0}$ shifts from the ON state to the OFF state, the clock signal $\varnothing_1$ shifts from the OFF state to the ON state, thereby connecting in the third switch 126 to the terminal corresponding to the clock signal $\varnothing_1$. In response, the charge stored at the capacitor 128a is output to the circuit at the rear stage through the third switch 126.

The clock signal $\varnothing_1$ having been in the ON state over the time length t then shifts from the ON state to the OFF state. As the clock signal $\varnothing_1$ is turned off, the clock signal $\varnothing_2$ enters in ON state. As the clock signals $\varnothing_2$ shifts into the ON state, the third switch 126 is connected to the terminal corresponding to the clock, signal $\varnothing_2$. In response, the charge stored at the capacitor 128b is output to the circuit at the rear stage through the third switch 126.

An electrical charge is stored at the capacitor 128b with the current output from the adder 112b when the first switch 122b is connected to the terminal corresponding to the clock signal $\varnothing_{C90}$. The clock signal $\varnothing_{C90}$ shifts from the ON state to the OFF state with the timing with which the clock signal $\varnothing_2$ is switched from the OFF state to the ON state. Accordingly, as the clock signal $\varnothing_2$ shifts into the ON state, the electrical charge stored at the capacitor 128b in response to the switchover of the clock signal $\varnothing_{C90}$ to the ON state is output to the circuit at the rear stage through the third switch 126.

The clock signal $\varnothing_2$ having been in the ON state over the time length t then shifts from the ON state to the OFF state. As the clock signal $\varnothing_2$ is turned off, the clock signal $\varnothing_3$ enters in ON state. As the clock signal $\varnothing_3$ shifts into the ON state, the third switch 126 is connected to the terminal corresponding to the clock signal $\varnothing_3$. In response, the charge stored at the capacitor 128c is output to the circuit at the rear stage through the third switch 126.

An electrical charge is stored at the capacitor 128c with the current output from the adder 112a when the first switch 122a is connected to the terminal corresponding to the clock signal $\varnothing_{C180}$. The clock signal $\varnothing_{C180}$ shifts from the ON state to the OFF state with the timing with which the clock signal $\varnothing_3$ is switched from the OFF state to the ON state. Accordingly, as the clock signal $\varnothing_3$ shifts into the ON state, the electrical charge stored at the capacitor 128c in response to the switchover of the clock signal $\varnothing_{C180}$ to the ON state is output to the circuit at the rear stage through the third switch 126.

When the time length t elapses following the switchover of the clock signal the clock signal $\varnothing_3$ from the OFF state to the ON state, the clock signal $\varnothing_3$ shifts from the ON state to the OFF state. As the clock signal $\varnothing_3$ is turned off, the clock signal $\varnothing_4$ enters in ON state. As the clock signal $\varnothing_4$ shifts into the ON state, the third switch 126 is connected to the terminal corresponding to the clock signal $\varnothing_4$. In response, the charge stared at the capacitor 128*d* is output to the circuit at the rear stage through the third switch 126.

An electrical charge is stored at the capacitor 128*d* with the current output from the adder 112*b* when the first switch 122*b* is connected to the terminal corresponding to the clock signal $\varnothing_{C270}$. The clock signal $\varnothing_{270}$ shifts from the ON state to the OFF state with the timing with which the clock signal $\varnothing_4$ is switched from the OFF state to the ON state. Accordingly, as the clock signal $\varnothing_4$ shifts into the ON state, the electrical charge stored at the capacitor 128*d* in response to the switchover of the clock signal $\varnothing_{C270}$ to the ON state is output to the circuit at the rear stage through the third switch 126.

When the time length t elapses following the switchover of the clock signal $\varnothing_4$ from the OFF state to the ON state, the clock signal $\varnothing_1$ shifts from the ON state to the OFF state. As the clock signals $\varnothing_1$~$\varnothing_4$ are repeatedly set to the ON/OFF states as described above, the electrical charges having been stored at the capacitors 128*a*, 128*b*, 128*c* and 128*d* are output to the circuit at the rear stage in sequence.

The capacitors having output the electrical charges therein to the circuit at the rear stage thereof are each grounded so as to initialize it by purging any residual charge in the capacitor. The capacitors are initialized via the second switch 124.

When the clock signal $\varnothing_1$ shifts into the OFF state and the clock signal $\varnothing_2$ shifts into the ON state, the second switch 124 becomes connected to the terminal corresponding to the clock signal $\varnothing_2$. As a result, the capacitor 128*a* is grounded via the second switch 124 and the residual charge in the capacitor 128*a* is discharged for initialization.

As the clock signal $\varnothing_2$, having been in the ON state over the time length t shifts from the ON state to the OFF state, the clock signal $\varnothing_3$ shifts from the OFF state to the ON state. In response to the switchover of the clock signal $\varnothing_3$ to the ON state, the second switch 124 is connected to the terminal corresponding to the clock signal $\varnothing_3$. Thus, the capacitor 128*b* becomes grounded via the second switch 124 and the residual charge in the capacitor 128*b* is discharged for initialization.

As the clock signal $\varnothing_3$, having been in the ON state over the time length t shifts from the ON state to the OFF state the clock signal $\varnothing_4$ shifts from the OFF state to the ON state. In response to the switchover of the clock signal $\varnothing_4$ to the ON state, the second switch 124 is connected to the terminal corresponding to the clock signal $\varnothing_4$. Thus, the capacitor 128*c* becomes grounded via the second switch 124 and the residual charge in the capacitor 128*c* is discharged for initialization.

As the clock signal $\varnothing_4$, having been in the ON state over the time length t shifts from the ON state the OFF state, the clock signal $\varnothing_1$ shifts from the OFF state to the ON state. In response to the switchover of the clock signal $\varnothing_1$ to the ON state, the second switch 124 is connected to the terminal corresponding to the clock signal $\varnothing_1$. Thus, the capacitor 128*d* becomes grounded via the second switch 124 and the residual charge in the capacitor 128*d* is discharged for initialization.

As the clock signals $\varnothing_1$~$\varnothing_4$ are alternately set to the ON/OFF states repeatedly, the residual charges in the capacitors 128*a*, 128*b*, 128*c* and 128*d* are discharged and the capacitors are thus initialized.

As explained above, since the capacitors 128*a*, 128*b*, 128*c* and 128*d* are engaged in the charge, the output and the initialization in repeated sequence with the time cycles t, the sampling operation is continuously executed over time cycles t.

Assuming that the operational sequence starting from the input to the operation at the adder 112*a* constitutes the operation of a single transconductor in the charge domain filter circuit 100 shown in FIG. 1, the change in the transconductance is represented by the staged triangular wave with a cycle 2t, indicated as Gm_phase 1 in FIG. 2. Likewise, assuming that the operational sequence starting from the input to the operation at the adder 112*b* constitutes the operation of a single transconductor, the change in the transconductance is represented by the staged triangular wave with a cycle 2t, indicated as Gm_phase 2 in FIG. 2, in a phase different from that of Gm_phase 1. Accordingly, the continuous time signals sliced out over the triangular wave windows, are integrated at the SINC filter circuit 120 in the charge domain filter circuit 100.

Figure 3A:
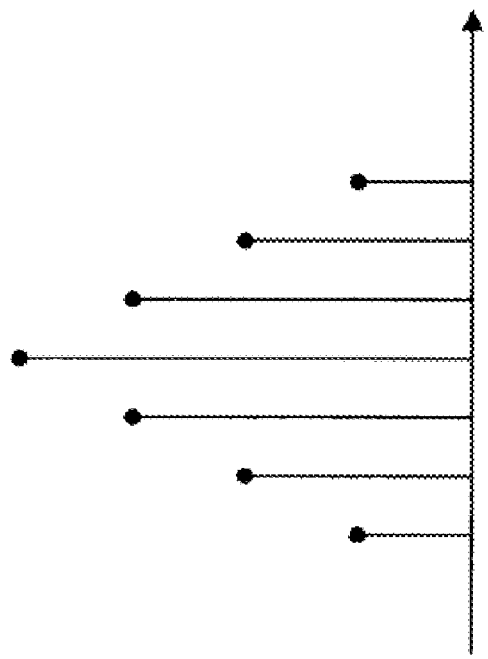
FIG. 3 shows how an impulse response may be obtained in the charge domain filter circuit in the first embodiment of the present invention.
Figure 3B:
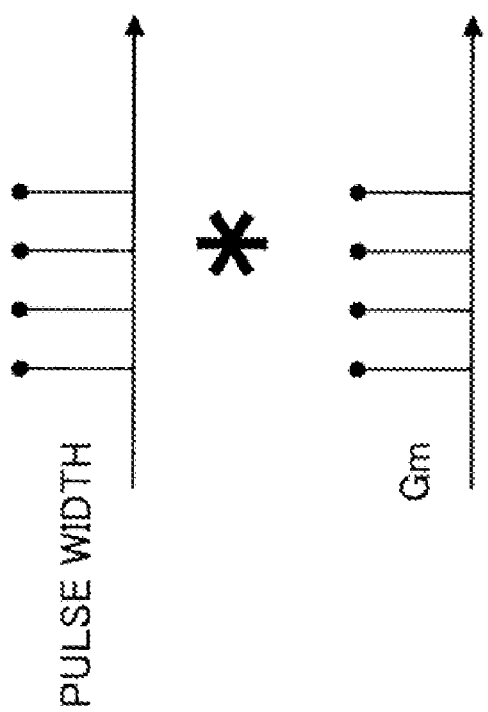

FIGS. 3A and 3B illustrate how impulse response is obtained in the charge domain filter circuit in the first embodiment of the present invention. As explained earlier, the continuous time signals sliced out over at the triangular wave windows are then integrated in the SINC filter circuit 120 in the charge domain filter circuit 100. This operation is equivalent to the convolution resulting in the triangular wave impulse response shown in FIG. 3B. In other words, that the charge domain filter circuit 100 operates as an FIR filter.

The triangular wave impulse response shown in FIG. 3B is the result of convolution of the two rectangular impulse shown in FIG. 3A. One of the rectangular impulses corresponds to the pulse width, whereas the other rectangular impulse correspond to the number of transconductors. Since the pulse width contains four clocks and four transconductors are used in the embodiment, the two rectangular impulses each include four impulse signals.

Figure 4:
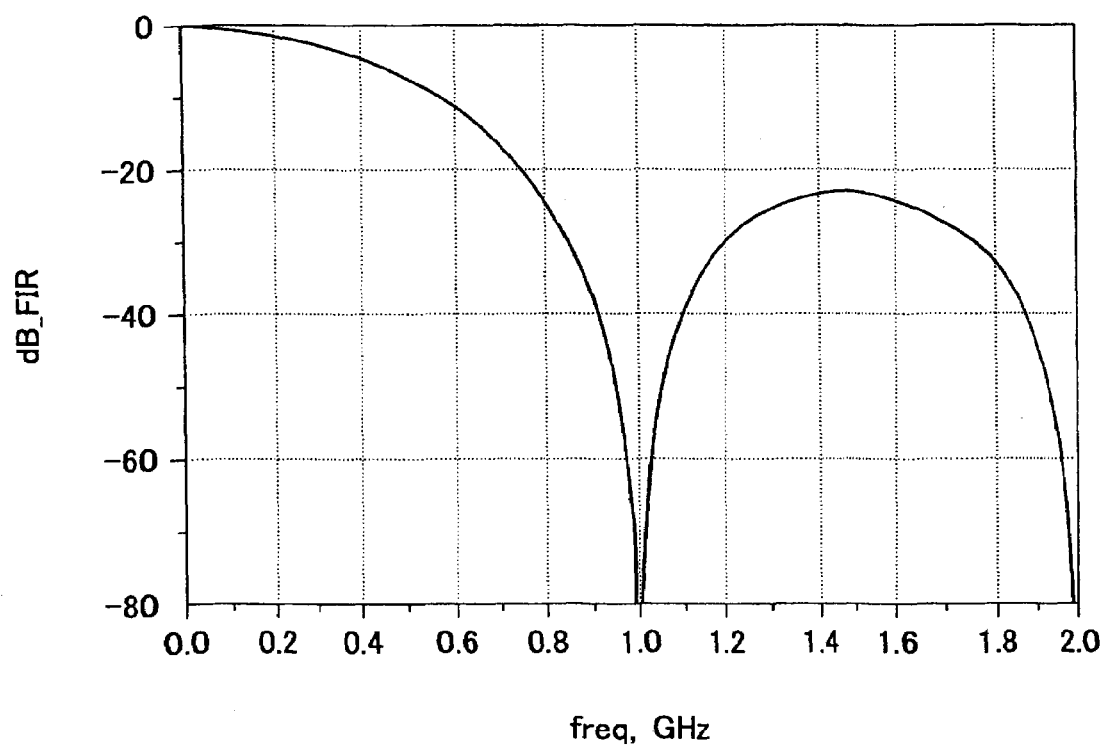
FIG. 4 is a diagram of a frequency response that may be obtained in the charge domain filter circuit in the first embodiment of the present invention.
Figure 19:
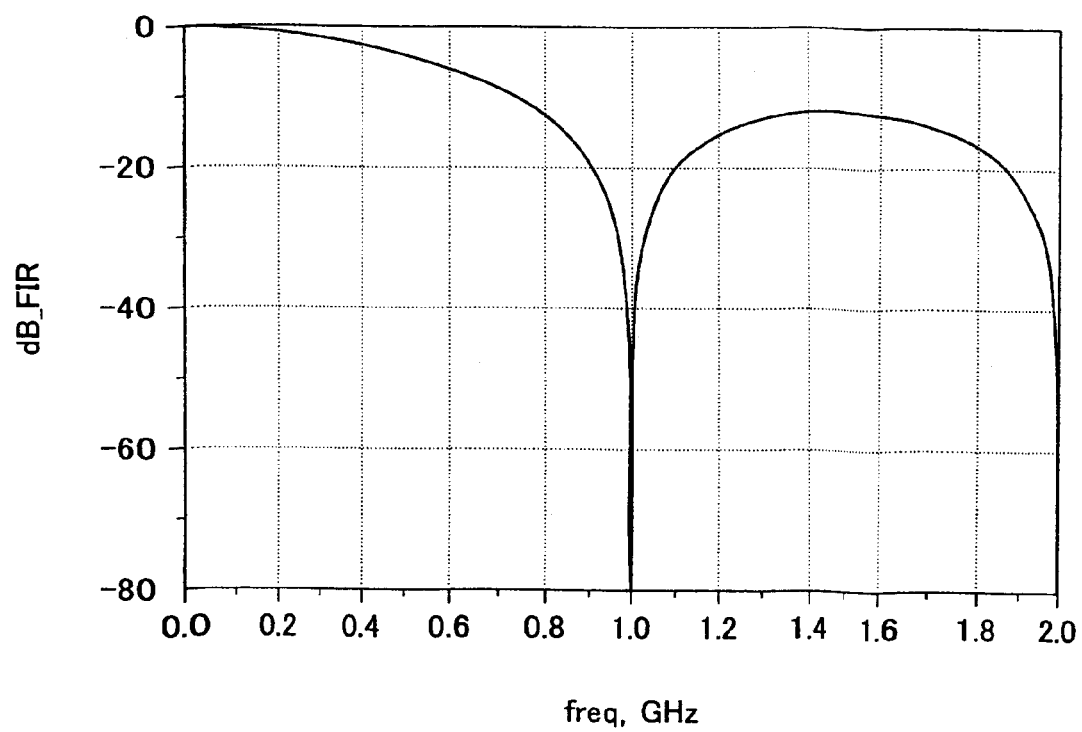
FIG. 19 is a diagram of the frequency characteristics of the charge domain filter circuit in the related art.

Since the two rectangular impulses are convoluted, the frequency response in the charge domain filter circuit 100 manifests characteristics equal to $SINC^2$. FIG. 4 presents a diagram of the frequency response in the charge domain filter circuit 100 in the first embodiment of the present invention achieved by setting the sampling cycle t to 1 ns. As shown in FIG. 4, the frequency characteristics in the charge domain filter circuit 100 assume lower values over the second lobe in the frequency range of 1/t~2/t i.e., in the frequency range of 1 GHz~2 GHz, compared to the frequency characteristics observed in the SINC filter circuit in the related art shown in FIG. 19.

The frequency characteristics in the charge domain filter circuit 100 achieved in the embodiment of the present invention can be altered by adjusting the levels of transconductance at the transconductors.

Figure 6:
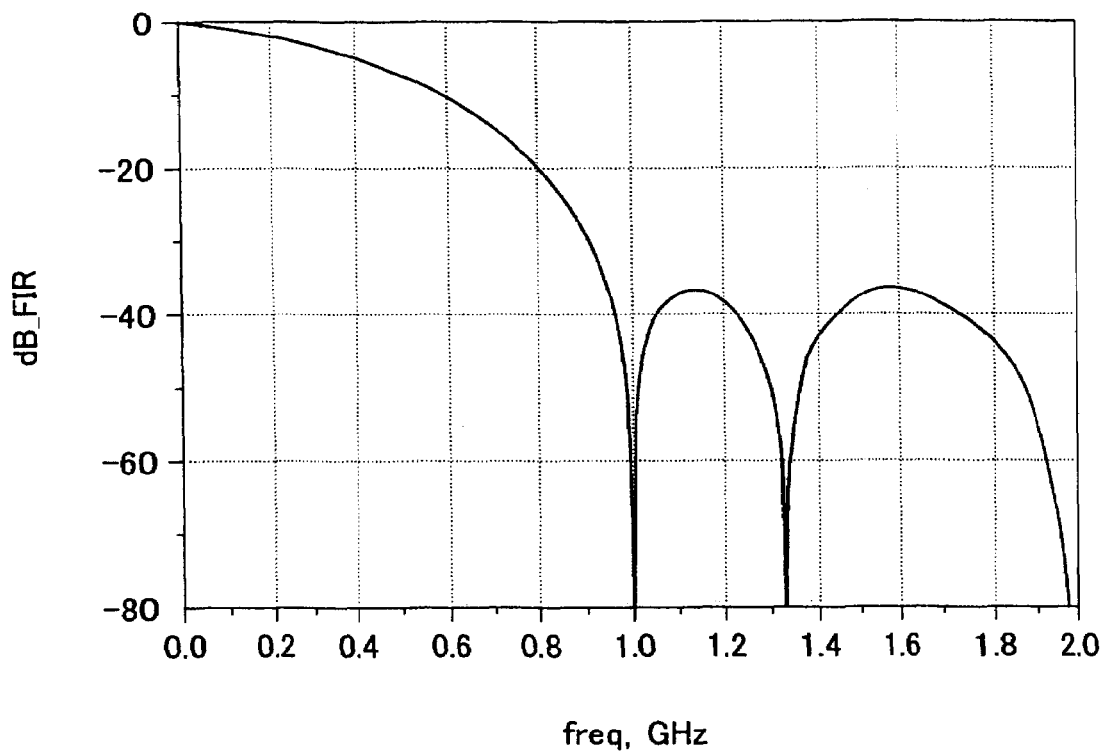
FIG. 6 is a diagram of the frequency response obtained in the charge domain filter circuit in conjunction with the impulse response in FIG. 5.

FIGS. 5A and 5B show how the impulse response in the charge domain circuit in the first embodiment of the present invention may be altered. For instance, if the transconductance at the transconductors 104 and 106 is double the transconductance at the transconductors 102 and 108, a trapezoidal impulse is generated, as indicated by Gm in FIG. 5A. Accordingly, the impulse response of the charge domain filter circuit 100 by varying the transconductance manifests as shown in FIG. 5B, and the charge domain filter circuit 100 achieves frequency characteristics such as those shown in the graph presented in FIG. 6 under these circumstances.

As explained earlier, the frequency characteristics can be adjusted freely by weighting the transconductance in the charge domain filter circuit achieved in the first embodiment of the present invention.

Second Embodiment

An explanation is given above in reference to the first embodiment of the present invention on a charge domain filter circuit, the frequency characteristics of which can be adjusted freely by controlling the timing with which the currents output from the transconductors are added up. Now, in reference to the second embodiment of the present invention, a charge domain filter circuit, the frequency characteristics of which can be adjusted freely by controlling the timing with which the electrical charges output from SINC filter circuits are added up, is described.

Figure 7:
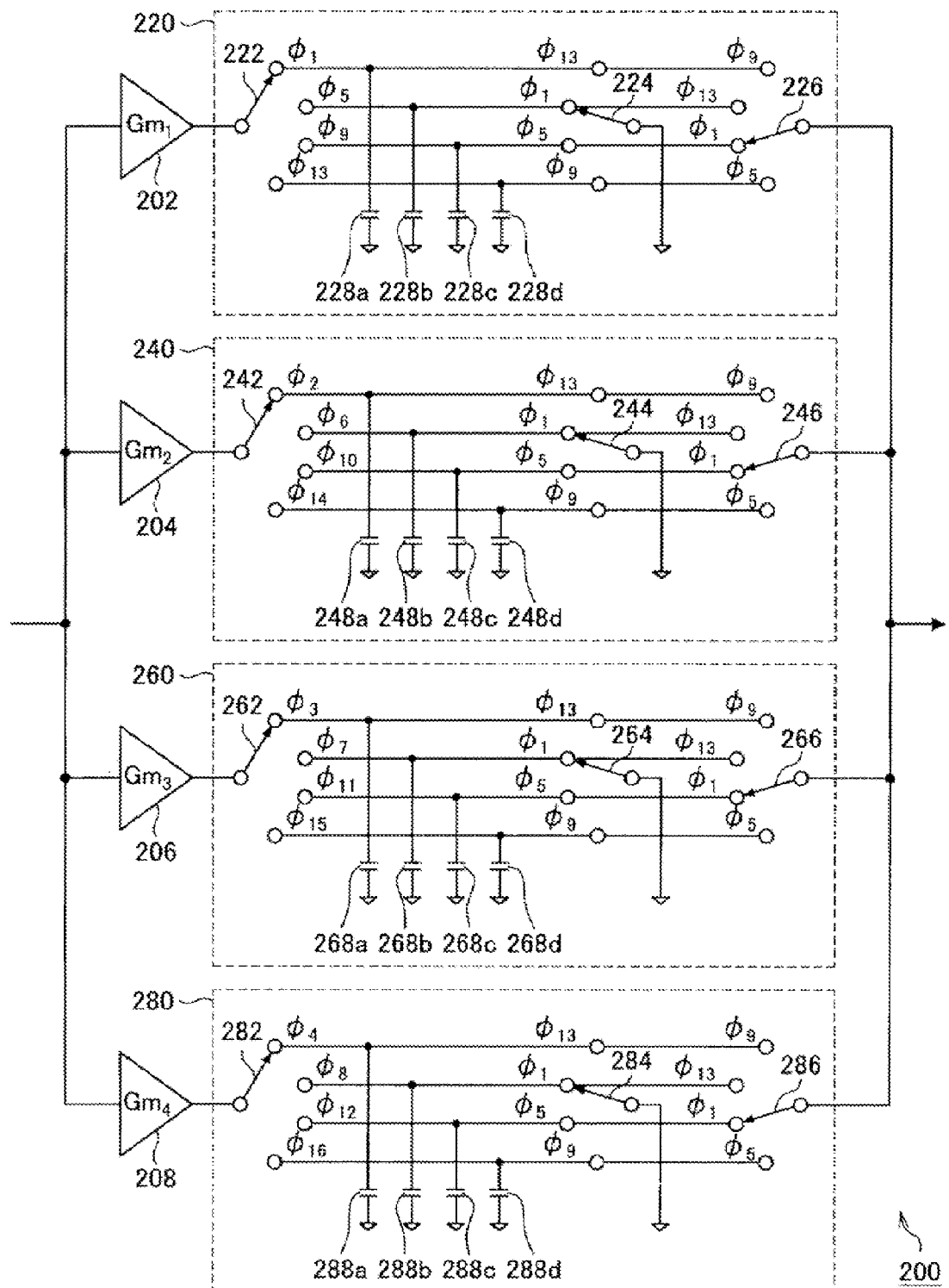
FIG. 7 shows the charge domain filter circuit achieved in a second embodiment of the present invention.

FIG. 7 illustrates the charge domain filter circuit achieved in the second embodiment of the present invention. The following is an explanation of the charge domain filter circuit achieved in the second embodiment of the present invention, given in reference to FIG. 7.

As shown in FIG. 7, a charge domain filter circuit 200 in the second embodiment of the present invention includes transconductors 202, 204, 206 and 208 and SINC filter circuits 220, 240, 260 and 280.

The SINC filter circuit 220 includes a first switch 222, a second switch 224, a third switch 226 and capacitors 228a, 228b, 228c and 228d. Likewise, the SINC filter circuit 240 includes a first switch 242, a second switch 244, a third switch 246 and capacitors 248a, 248b, 248c and 248d, the SINC filter circuit 260 includes a first switch 262, a second switch 264, a third switch 266 and capacitors 268a, 268b, 268c and 268d hand the SINC filter circuit 280 includes a first switch 282, a second switch 284, a third switch 286 and capacitors 288a, 288b, 288c and 288d.

The transconductors 202, 204, 206 and 208 each output a current in proportion to the voltage of an input signal. While four transconductors are used to constitute the charge domain filter circuit in the embodiment, the number of transconductors in a charge domain filter circuit embodying the present invention is not limited to four. In addition, the transconductors may assume transconductance values equal to one another or they may assume transconductance values different from one another. The following explanation is provided by assuming that the four transconductors all assume transconductance values equal to one another.

Capacitors to be electrically charged are selected via the first switches 222, 242, 262 and 282. A specific capacitor among the capacitors 228a, 228b, 228c and 228d is selected through the first switch 222. Likewise, a specific capacitor among the capacitors 248a, 248b, 248c and 248d is selected through the first switch 242, a specific capacitor among the capacitors 268a, 268b, 268c and 268d is selected through the first switch 262 and a specific capacitor among the specific capacitors 288a, 288b, 288c and 288d is selected through the first switch 282. It is assumed that the first switches 222, 242, 262 and 282 in the embodiment each include four terminals which are switched by using four clock signals assuming different phases.

Capacitors to undergo initialization are selected via the second switches 224, 244, 264 and 284. The capacitors in the SINC filter circuits 220, 240, 260 and 280, which are to be initialized so as to rid them of any residual electrical charges, are selected through the second switches 224, 244, 264 and 284. In the charge domain filter circuit 200 achieved in the embodiment, terminals are switched by using four types of clock signals and the capacitor connected to a selected terminal is initialized so as to purge the capacitor of the electrical charge attributable to a previous signal. It is to be noted that the present invention may be adopted in conjunction with second switches equipped with a different number of terminals.

Capacitors from which the electrical charges are to be output are selected via the third switches 226, 246, 266 and 286. The capacitors in the SINC filter circuits 220, 240, 260 and 280, from which the electrical charges having been stored therein are to be output to the circuit at the rear stage, are selected through the third switches 226, 246, 266 and 286. In the charge domain filter circuit 200 achieved in the embodiment, terminals are switched by using four types of clock signals and the electrical charge stored at the capacitor connected to a selected terminal is output to the circuit at the rear stage.

It is to be noted that the present invention is not limited to the example described above with regard to the quantities of the various types of switches and the number of terminals included in each type of switch.

Electrical charges are stored at the capacitors 228a, 228b, 228c, 228d, 248a, 248b, 248c, 248d, 268a, 268b, 268c, 268d, 288a, 288b, 288c and 288d. It is desirable that all the capacitors have the same capacitance. It is to be noted that while each SINC filter circuit in the embodiment includes four capacitors, the quantity of capacitors to be included in each SINC filter circuit is not limited to four.

Next, the operations executed in the charge domain filter circuit in the second embodiment of the present invention, adopting the structure described above, are explained.

Figure 8:
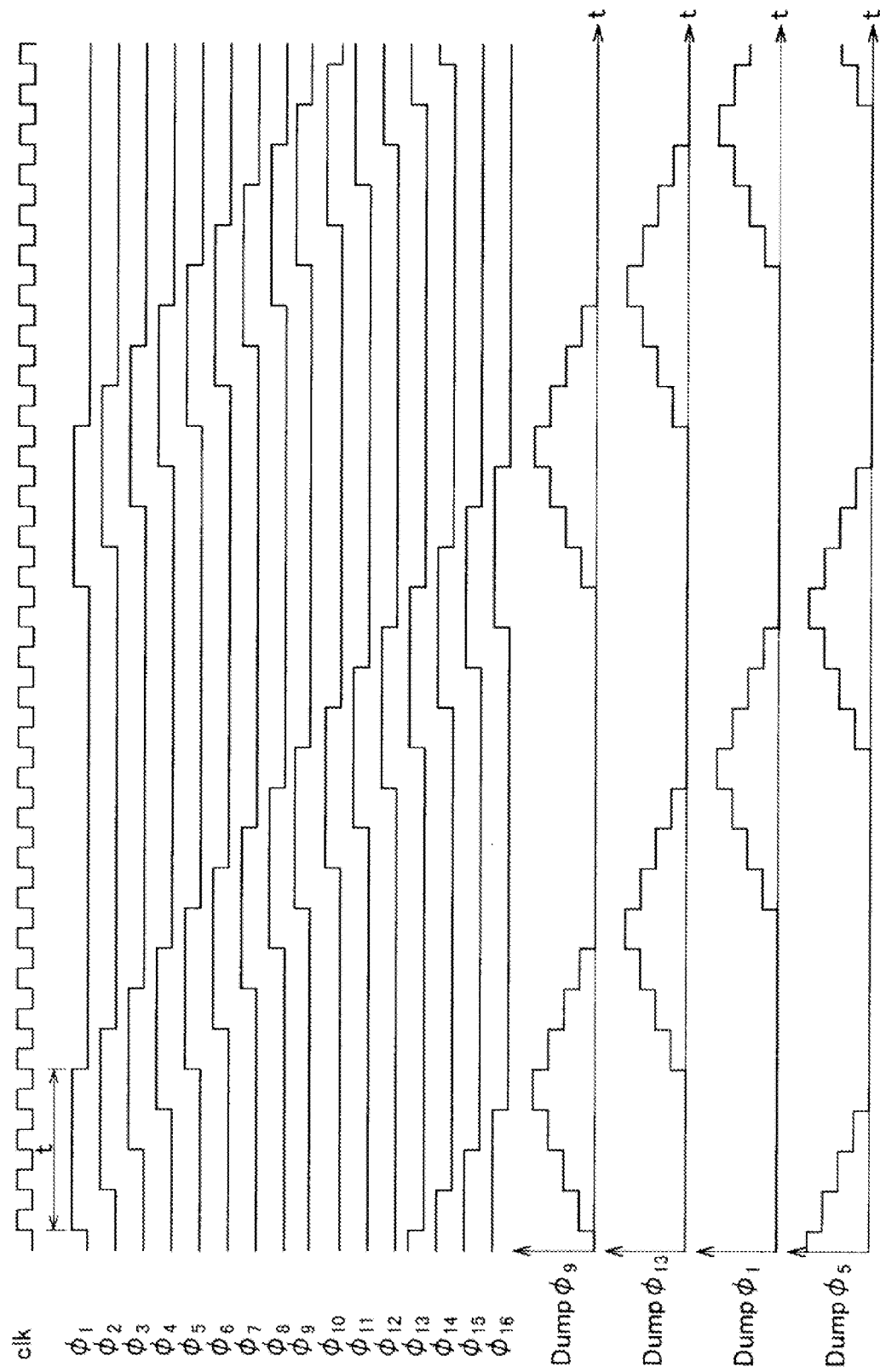
FIG. 8 is a chart of clock signals input to the charge domain filter circuit in the second embodiment of the present invention.

FIG. 8 presents a chart of the clock signals input to the charge domain filter circuit in the second embodiment of the present invention. Sixteen types of clock signals $\varnothing_1$~$\varnothing_{16}$ are input to the charge domain filter circuit 200.

The first switch 222 is controlled based upon four types of clock signals $\varnothing_1$, $\varnothing_5$, $\varnothing_9$, and $\varnothing_{13}$. As the clock signal $\varnothing_1$ shifts from the OFF state to the ON state, the first switched 222 is connected to a terminal corresponding to the clock signal $\varnothing_1$.

As the first switch 222 is connected to the terminal corresponding to the clock signal $\varnothing_1$, the current output from the transconductor 202 is input to the capacitor 228a. The capacitor 228a is then electrically charged with the output current from the transconductor 202.

As the time length t elapses and the clock signal $\varnothing_1$ shifts from the ON state to the OFF state, the clock signal $\varnothing_5$ is switched from the OFF state to the ON state. In response to the switchover of the clock signal $\varnothing_5$ from the OFF state to the ON state, the first switch 222 is connected to the terminal corresponding to the clock signal $\varnothing_5$.

As the first switch 222 is connected to the terminal corresponding to the clock signal $\varnothing_5$, the current output from the transconductor 202 is input to the capacitor 228b. The capacitor 228b is then electrically charged with the output current from the transconductor 202.

As the time length t elapses again and the clock signal $\varnothing_5$ shifts from the ON state to the OFF state, the clock signal $\varnothing_9$ is switched from the OFF state to the ON state. In response to the switchover of the clock signal $\varnothing_9$ from the OFF state to the ON state the first switch 222 is connected to the terminal corresponding to the clock signal $\varnothing_9$.

As the first switch 222 is connected to the terminal corresponding to the clock signal $\varnothing_9$, the current output from the transconductor 202 is input to the capacitor 228c. The capacitor 228c is then electrically charged with the output current from the transconductor 202.

As the time length t elapses yet again and the clock signal $Ø_9$ shifts from the ON state to the OFF state, the clock signal $Ø_{13}$ is switched from the OFF state to the ON state. In response to the switchover of the clock signal $Ø_{13}$ from the OFF state to the ON state, the first switch 222 is connected to the terminal corresponding to the clock signal $Ø_{13}$.

As the first switch 222 is connected to the terminal corresponding to the clock signal $Ø_{13}$, the current output from the transconductor 202 is input to the capacitor 228d. The capacitor 228d is then electrically charged with the output current from the transconductor 202.

As the time length t elapses yet again and the clock signal $Ø_{13}$ shifts from the ON state to the OFF state the clock signal $Ø_1$ is switched from the OFF state to the ON state. By alternately setting the clock signals $Ø_1$, $Ø_5$, $Ø_9$ and $Ø_{13}$ to the ON/OFF states repeatedly as described above, the first switch 222 is connected to different terminals so as to store electrical charges at the capacitors 228a, 228b, 228c and 228d in sequence with the output current from the transconductor 202.

As explained above, the individual capacitors in the SINC filter circuit 220 are electrically charged by repeatedly setting the four clock signals $Ø_1$, $Ø_5$, $Ø_9$, and $Ø_{13}$ to the ON/OFF states. Likewise, the individual capacitors in the SINC filter circuits 240, 260 and 280 are electrically charged by repeatedly setting clock signals to the ON/OFF states. However, electrical charges are stored at the capacitors in the other SINC filter circuits by turning ON/OFF clock signals assuming phases different from those of the clock signals input to the first switch 222 in the SINC filter circuit 220.

For instance, four clock signals $Ø_2$, $Ø_6$, $Ø_{10}$, and $Ø_{14}$ are input to the first switch 242 in the SINC filter circuit 240. These clock signals assume phases offset by t/4 relative to the phases of the clock signals $Ø_1$, $Ø_5$, $Ø_9$, and $Ø_{13}$ respectively, as shown in FIG. 8.

In addition, clock signals $Ø_3$, $Ø_7$, $Ø_{11}$, and $Ø_{15}$ are input to the first switch 262 in the SINC filter circuit 260. These clock signals assume phases offset by t/2 relative to the phases of the clock signals $Ø_1$, $Ø_5$, $Ø_9$, and $Ø_{13}$ respectively, as shown in FIG. 8. Clock signals $Ø_4$, $Ø_8$, $Ø_{12}$, and $Ø_{16}$ are input to the first switch 282 in the SINC filter circuit 280. These clock signals assume phases offset by 3t/4 relative to the phases of the clock signals $Ø_1$, $Ø_5$, $Ø_9$, and $Ø_{13}$ respectively, as shown in FIG. 8.

By inputting clock signals in different phases to the SINC filter circuits, the timing with which the capacitors in the individual SINC fitter circuits are charged can be shifted.

The electrical charges stored at the capacitors are output to the circuit at the rear stage via the third switches 226, 246, 266 and 286. Terminals at the third switches 226, 246, 266 and 286 are switched by turning ON/OFF four clock signals $Ø_1$, $Ø_5$, $Ø_9$, and $Ø_{13}$ different phases so as to output the electrical charges stored at specific capacitors to the circuit at the rear stage. The clock signals $Ø_1$, $Ø_5$, $Ø_9$, and $Ø_{13}$ used for the charge output are the same as the clock signals input to the first switch 222.

The electrical charge stored at the capacitor 228a with the output current from the transconductor 202 while clock signal $Ø_1$ is held in the ON state, is then output to the circuit at the rear stage as the clock signal $Ø_5$ is set to the ON state. Likewise, the charge at the capacitor 228b, the charge at the capacitor 228c and the charge at the capacitor 228d are output to the circuit at the rear stage respectively when the clock signal $Ø_{13}$ is in the ON state, when the clock signal $Ø_1$ is in the ON state and when the clock signal $Ø_5$ is in the ON state.

The charges stored at the capacitors in the SINC filter circuits 240, 260 and 280, as well as the charges stored at the capacitors in the SINC filter circuit 220, are output to the circuit at the rear stage. As are the terminals at the third switch 224 in the SINC filter circuit 220, the terminals at the third switch 246 in the SINC filter circuit 240, the terminals at the third switch 264 in the SINC filter circuit 260 and the terminals at the third switch 284 in the SINC filter circuit 280 are switched by turning ON/OFF the clock signals $Ø_1$, $Ø_5$, $Ø_9$, and $Ø_{13}$.

While the capacitors 228a, 248a, 268a and 288a are charged in response to the inputs of the clock signals $Ø_1$, $Ø_2$, $Ø_3$, and $Ø_4$ in different phases, the electrical charges stored at these capacitors are output simultaneously as the clock signal $Ø_9$ enters the ON state. Thus, the electrical charges stored at the capacitors 228a, 248a, 268a and 288a are added up and their sums output to the circuit at the rear stage.

The capacitors in each of the other sets of capacitors, too, are charged in response to the inputs of clock signals in different phases but the stored charges are output to the circuit at the rear stage in response to the input of a single clock signal. While the capacitors 228b, 248b, 268b and 288b are charged in response to the inputs of the clock signals $Ø_5$, $Ø_6$, $Ø_7$, and $Ø_8$ in different phases, the electrical charges stored at these capacitors are output simultaneously as the clock signal $Ø_{13}$ enters the ON state. While the capacitors 228c, 248c, 268c and 288c are charged in response to the inputs of the clock signals $Ø_9$, $Ø_{10}$, $Ø_{11}$, and $Ø_{12}$ in different phases, the electrical charges stored at these capacitors are output simultaneously as the clock signal $Ø_1$ enters the ON state. Likewise, while the capacitors 228d, 248d, 268d and 288d are charged in response to the inputs of the clock signals $Ø_{13}$, $Ø_{14}$, $Ø_{15}$, and $Ø_{16}$ in different phases, the electrical charges stored at these capacitors are output simultaneously as the clock signal $Ø_5$ enters the ON state.

As the electrical charges in the individual capacitors are output to the circuit at the rear stage via the third switches 226, 246, 266 and 286, any residual charges that may remain in the capacitors are purged so as to initialize the capacitors by grounding the capacitors. The capacitors are initialized via the second switches 224, 244, 264 and 284. Terminals at the second switches are switched by turning ON/OFF four clock signals $Ø_1$, $Ø_5$, $Ø_9$, and $Ø_{13}$ in different phrases.

As the clock signal $Ø_9$ is turned off and the clock signal $Ø_{13}$ is turned on, the second switch 224 is connected to the terminal corresponding to the clock signal $Ø_{13}$. As a result, the capacitor 228a becomes grounded via the second switch 224 and any residual electrical charge present in the capacitor 228a is discharged, thereby initializing the capacitor. When the clock signal $Ø_9$ is turned off and the clock signal $Ø_{13}$ is turned on, the other second switches 244, 264 and 284 are also connected to the terminals corresponding to the lock signal $Ø_{13}$. Thus, residual electrical charges present air the capacitors 248a, 268a and 288a are discharged, thereby initializing the capacitors 248a, 268a and 288a.

As the clock signal $Ø_{13}$ having been in the ON state over the time length t is switched from the ON state to the OFF state, the clock signal $Ø_1$ is switched from the OFF state to the ON state. As the clock signal $Ø_1$ enters the ON state, the second switch 224 is connected to the terminal corresponding to the clock signal $Ø_1$. As a result, the capacitor 228b is grounded via the second switch 224 and the residual charge present in the capacitor 228b is discharged, thereby initializing the capacitor 228b. When the clock signal $Ø_{13}$ is turned off and the clock signal $Ø_1$ is turned on, the other second switches 224, 264 and 284 are also connected to the terminals corresponding to the clock signal $\varnothing_1$, and the residual electrical charges still present in the capacitors 248b, 268b and 288b are discharged, thereby initializing the capacitors 248b, 268b and 288b.

As the clock signal $\varnothing_1$ having been in the ON state over the time length t is switched from the ON state to the OFF state, the clock signal $\varnothing_5$ is switched from the OFF state to the ON state. As the clock signal $\varnothing_5$ enters the ON state, the second switch 224 is connected to the terminal corresponding to the clock signal $\varnothing_5$. As a result, the capacitor 228c is grounded via the second switch 224 and the residual charge present in the capacitor 228c is discharged, thereby initializing the capacitor 228c. When the clock signal $\varnothing_1$ is turned off and the clock signal $\varnothing_5$ is turned on, the other second switches 224, 264 and 284 are also connected to the terminals corresponding to the clock signal $\varnothing_5$, and the residual electrical charges still present in the capacitors 248c, 268c and 288c are discharged, thereby initializing the capacitors 248c, 268c and 288c.

As the clock signal $\varnothing_5$ having been in the ON state over the time length t is switched from the ON state to the OFF state, the clock signal $\varnothing_9$ is switched from the OFF state to the ON state. As the clock signal $\varnothing_9$ enters the ON state, the second switch 224 is connected to the terminal corresponding to the clock signal $\varnothing_9$. As a result, the capacitor 228d is grounded via the second switch 224 and the residual charge present in the capacitor 228d is discharged, thereby initializing the capacitor 228d. When the clock signal $\varnothing_5$ is turned off and the clock signal $\varnothing_9$ is turned on, the second switches 224, 264 and 284 are also connected to the terminals corresponding to the clock signal $\varnothing_9$, and the residual electrical charges still present in the capacitors 248d, 268d and 288d are discharged, thereby initializing the capacitors 248d, 268d and 288d.

By repeatedly turning ON/OFF the clock signals $\varnothing_1$, $\varnothing_5$, $\varnothing_9$, and $\varnothing_{13}$ as described above, the residual electrical charges in the capacitors 228a, 228b, 228c and 228d in the SINC filter circuit 220 are discharged, thereby initializing the individual capacitors. Likewise, the capacitors in the SINC filter circuits 240, 260 and 280 are initialized by inputting the clock signals $\varnothing_1$, $\varnothing_5$, $\varnothing_9$, and $\varnothing_{13}$ to the second switches 244, 264 and 284 respectively.

As described above, each capacitor is engaged in the charge, the output and the initialization without a break. Dump $\varnothing_9$ in FIG. 8 indicates the change occurring in the overall quantity of electrical charge output to the circuit at the rear stage when the clock signal $\varnothing_9$ is input to the third switches 226, 246, 266 and 286. The timing with which the capacitors 228a, 248a, 268a and 288a, for instance, are electrically charged is controlled by using the clock signals $\varnothing_1$~$\varnothing_4$. Since the clock signals $\varnothing_1$~$\varnothing_4$ in different phases, the overall quantity of the electrical charge output to the circuit at the rear stage in response to the input of the clock signal $\varnothing_9$ changes in steps over time. Accordingly, the total sum of the electrical charges having been stored at the capacitors 228a, 248a, 268a and 288a is equivalent to the results of an integration of continuous time signals sliced out with triangular wave windows as indicated by Dump $\varnothing_9$ in FIG. 8.

Likewise, the total sum of the electrical charges having been stored at the capacitors 228b, 248b, 268b and 288b is equivalent to the results of an integration of continuous time signals sliced out with triangular wave windows as indicated by Dump $\varnothing_{13}$ in FIG. 8, the total sum of the electrical charges having been stored at the capacitors 228c, 248c, 268c and 288c is equivalent to the results of an integration of continuous time signals sliced out with a triangular wave window such as Dump $\varnothing_1$ in FIG. 8, and the total sum of the electrical charges having been stored at the capacitors 228d, 248d, 268d and 288d is equivalent to the results of air integration of continuous time signals sliced out with triangular wave windows as indicated by Dump $\varnothing_5$ in FIG. 8. Thus, the sampling operation and the filtering operation of the FIR filter are seamlessly executed based upon time intervals t.

As in the charge domain filter circuit 100 in the first embodiment of the present invention, an impulse response of the charge domain filter circuit 200 is obtained as shown in FIG. 7 through convolution of two rectangular impulses. The impulse response obtained in the charge domain filter circuit 200 is a triangular wave impulse response similar to that shown in FIG. 3B. Thus, the charge domain filter circuit 200 is able to operate as an FIR filter and assuming that the sampling cycle t is 1 ns, the charge domain filter circuit 200 achieves frequency characteristics similar to those in the frequency response in the charge domain filter circuits 100 shown in FIG. 4.

The frequency characteristics of the charge domain filter circuit 200 achieved in the second embodiment of the present invention, too, can be altered by adjusting the levels of transconductance at the transconductors.

For instance, if the transconductance at the transconductors 204 and 206 are double the transconductance at the transconductors 202 and 208, a trapezoidal impulse is generated, indicated as indicated by Gm in FIG. 5A. Accordingly, the impulse response of the charge domain filter circuit 200 as does the impulse response in the charge domain filter circuit 100 in the first embodiment of the present invention. As a result, by varying the transconductance manifests as shown in FIG. 5B, the charge domain filter circuit 200, too, achieves frequency characteristics such as those shown in the graph presented in FIG. 6.

Namely, the charge domain filter circuit in the second embodiment of the present invention, too, forms an FIR filter that allows the frequency characteristics thereof to be adjusted by varying the weight applied to the transconductance.

As explained earlier, the frequency characteristics can be adjusted freely by weighting the transconductance in the charge domain filter circuit achieved in the second embodiment of the present invention.

As explained above, an impulse response in an FIR filter can be obtained through convolution of weighted transconductance and rectangular windows used for electrical current integration. Accordingly, by adjusting the weight applied to the transconductance or altering the length of time over which clocks used to charge the capacitors remain in the ON state various forms of impulse response can be obtained in the FIR filer.

APPLICATION EXAMPLE 1

Figure 9B:
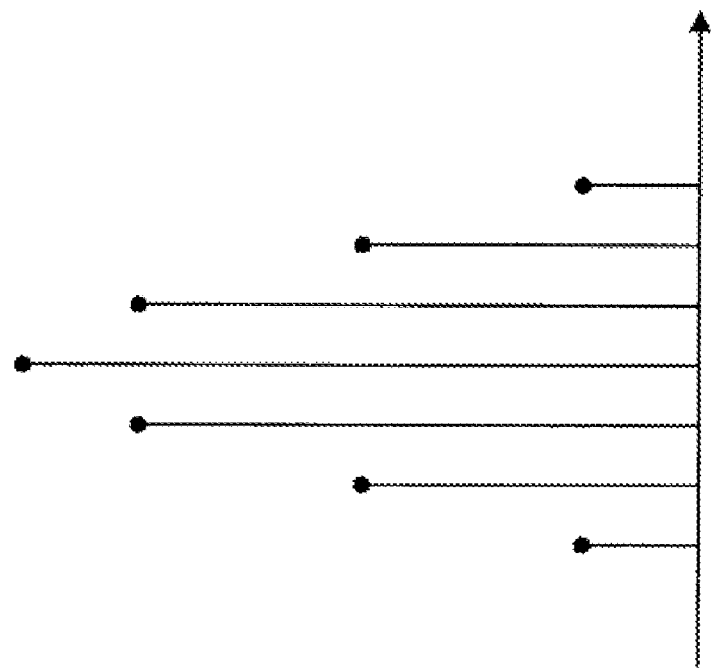
FIG. 9 shows an example of impulse response.
Figure 9A:
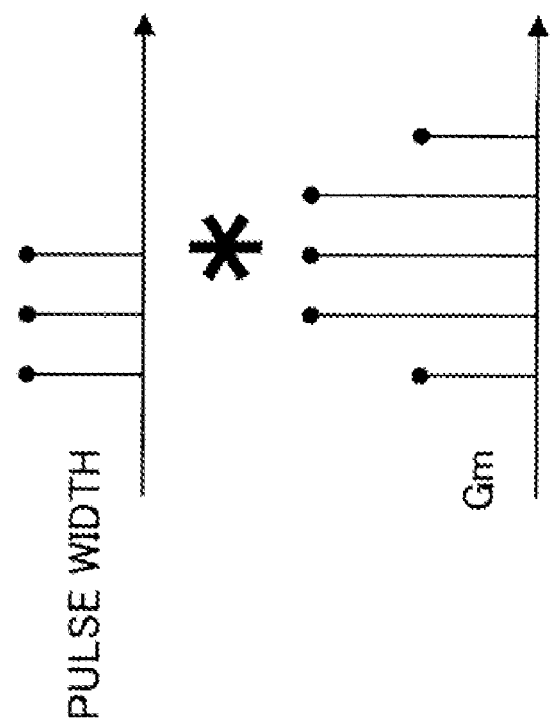

FIGS. 9A and 9B illustrate an example of impulse response. When the pulse width of the clocks used to charge the capacitors includes three clocks and the charge domain filter circuit includes five transconductors, with three transconductors among them assuming a transconductance twice that of the remaining two, as shown in FIG. 9A, the impulse response shown in FIG. 9B is obtained. The impulse response shown in FIG. 9B is identical to that shown in FIG. 5B. Accordingly, assuming that the sampling cycle t is equal to 1 ns, the frequency characteristics achieved under these circumstances, too, are as indicated by the graph in FIG. 6.

APPLICATION EXAMPLE 2

Figure 10B:
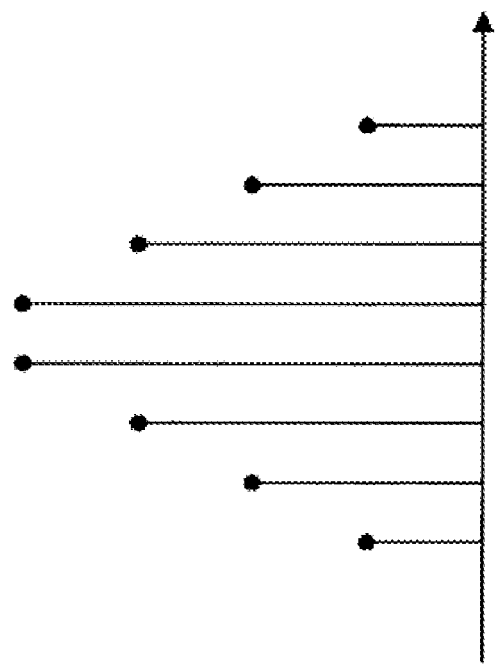
FIG. 10 shows another example of impulse response.
Figure 10A:
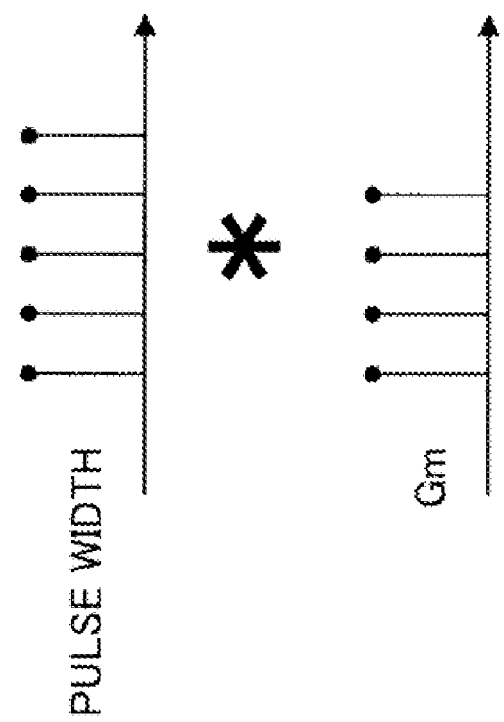
Figure 11:
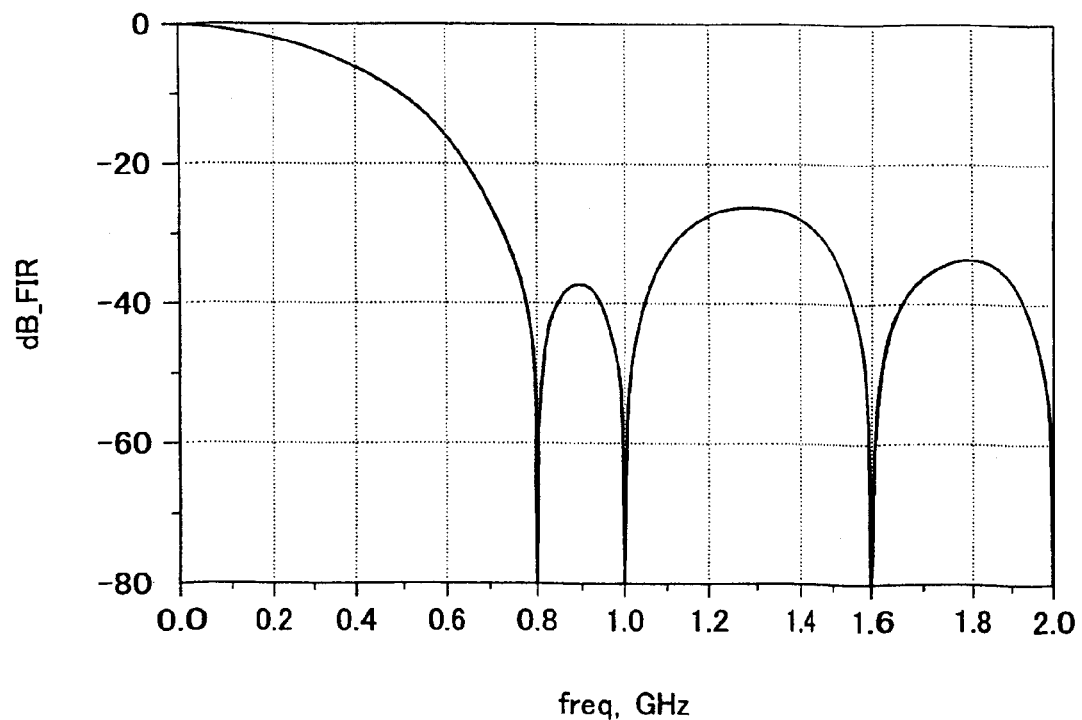
FIG. 11 is a diagram of the frequency response obtained in the charge domain filter circuit in conjunction with the impulse for spots in FIG. 10.

FIGS. 10A and 10B illustrate another example of impulse response. When the pulse width of the clocks used to charge the capacitors includes five clocks and the charge domain filter circuit includes three transconductors all having equal transconductance, as shown in FIG. 10A, the impulse response shown in FIG. 10B is obtained. Assuming that the sampling cycle t is equal to 1 ns, the frequency characteristics achieved under these circumstances are as indicated by the graph in FIG. 1.

APPLICATION EXAMPLE 3

Figure 13:
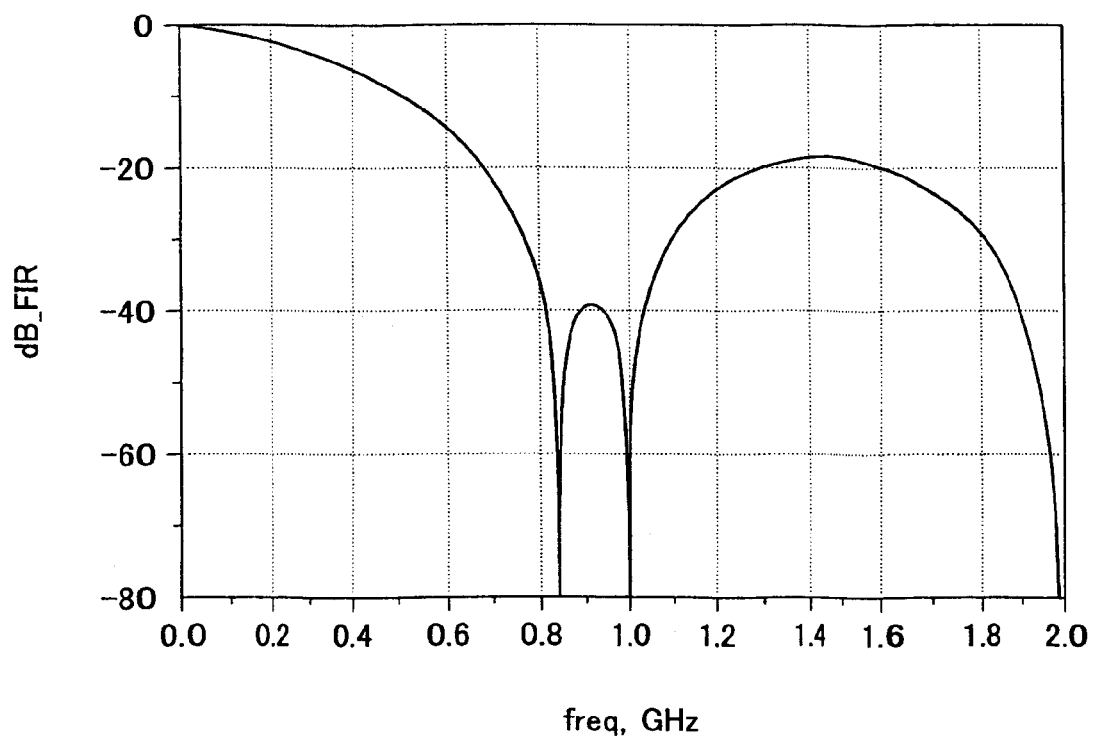
FIG. 13 is a diagram of the frequency response obtained in the charge domain filter circuit in conjunction with the impulse response in FIG. 12.

FIGS. 12A and 12B illustrate yet another example of impulse response. When the pulse width of the clocks used to charge the capacitors includes four clocks and the charge domain filter circuit includes four transconductors with two transconductors among them having transconductance twice that of the remaining two transconductors, as shown in FIG. 12A, the impulse response shown in FIG. 12B is obtained. Assuming that the sampling cycle t is equal to 1 ns, the frequency characteristics achieved under these circuit are as indicated by the graph in FIG. 13.

APPLICATION EXAMPLE 4

Figure 14A:
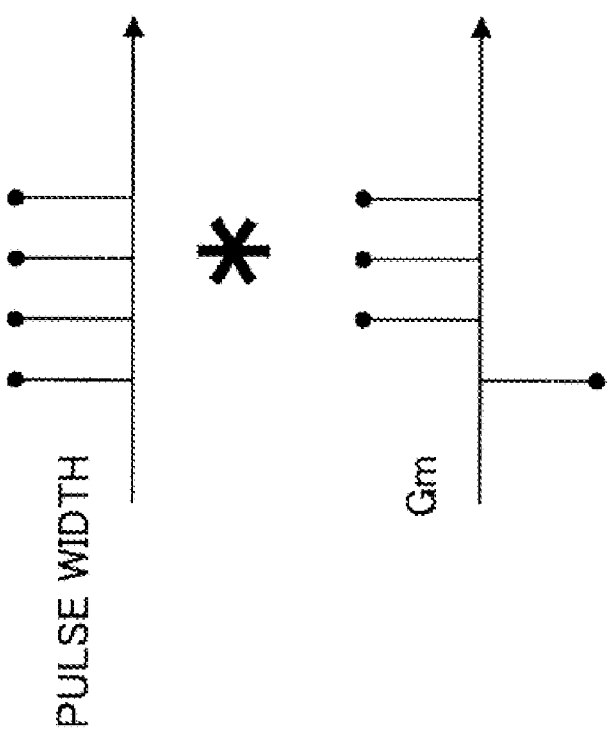
FIG. 14 shows yet another example of impulse response.
Figure 14B:
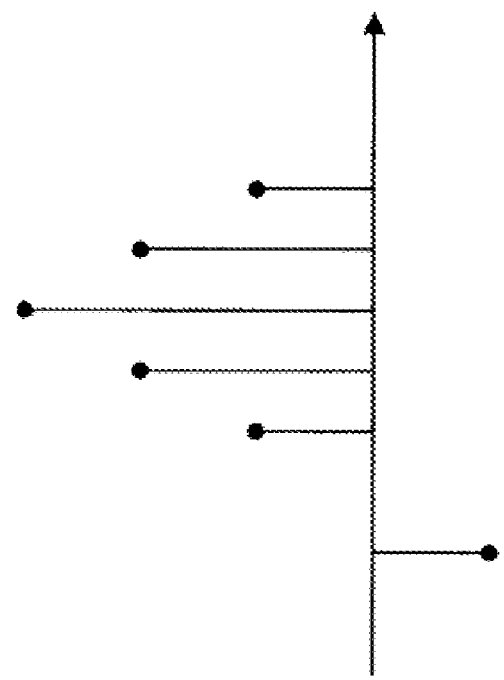
Figure 15:
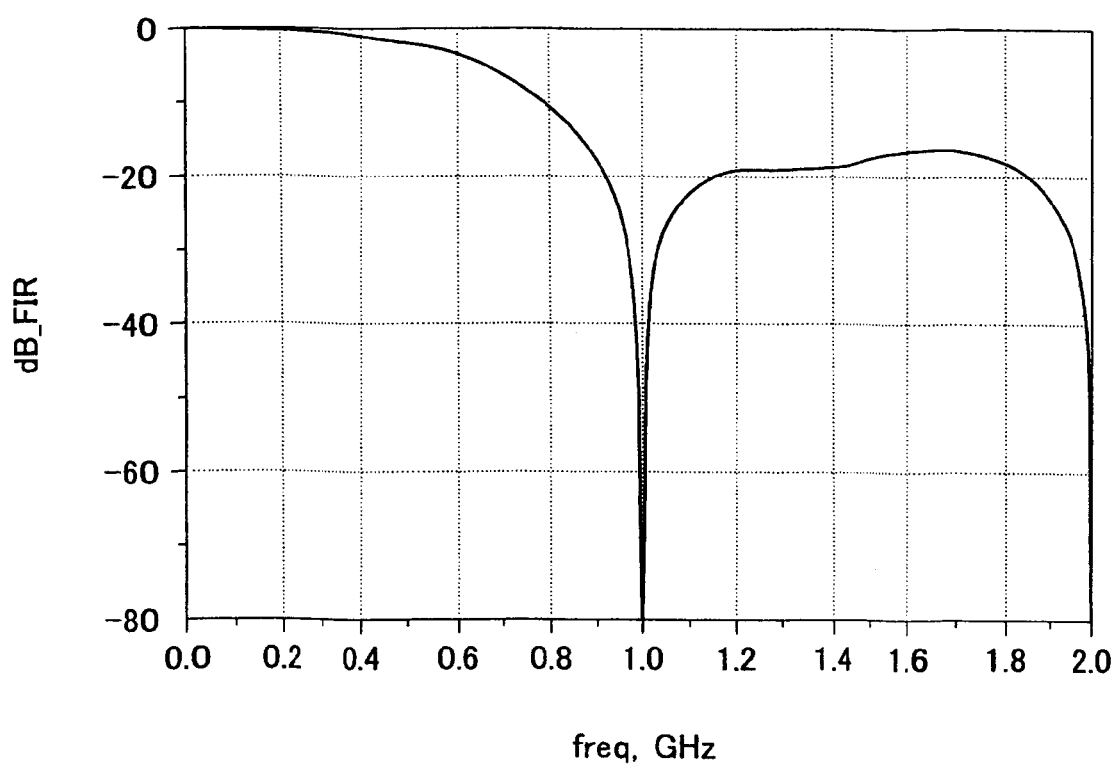
FIG. 15 is a diagram of the frequency response obtained in the charge domain filter circuit in conjunction with the impulse for spots in FIG. 14.

FIGS. 14A and 14B illustrate another example of impulse response. When the pulse width of the clocks used to charge the capacitors includes four clocks and the charge domain filter circuit includes four transconductors with one transconductor having transconductance with a polarity opposite from the polarity at the remaining three transconductors, as shown in FIG. 14A, the impulse response shown in FIG. 14B is obtained. Assuming that the sampling cycle t is equal to 1 ns, the frequency characteristics achieved under these circumstances are as indicated by the graph in FIG. 15.

By altering the pulse width of clocks used to charge the capacitors or the transconductance at the individual transconductors as described above, various frequency characteristics can be achieved. In other words, by adjusting the transconductance or the capacitor charge time in correspondence to the band of the signal to be passed through or specific purposes of use, a single circuit can be utilized to pass signals in varying bands, which, in turn, makes it possible to subscribe to a plurality of wireless communication services without having to increase the circuit scale.

Third Embodiment

Band pass charge sampling (BPCS; see Nonpatent Reference Literature 2) executed by utilizing the charge domain filter circuit achieved in the third embodiment of the present invention is explained as another application example of the present invention.

Figure 16:
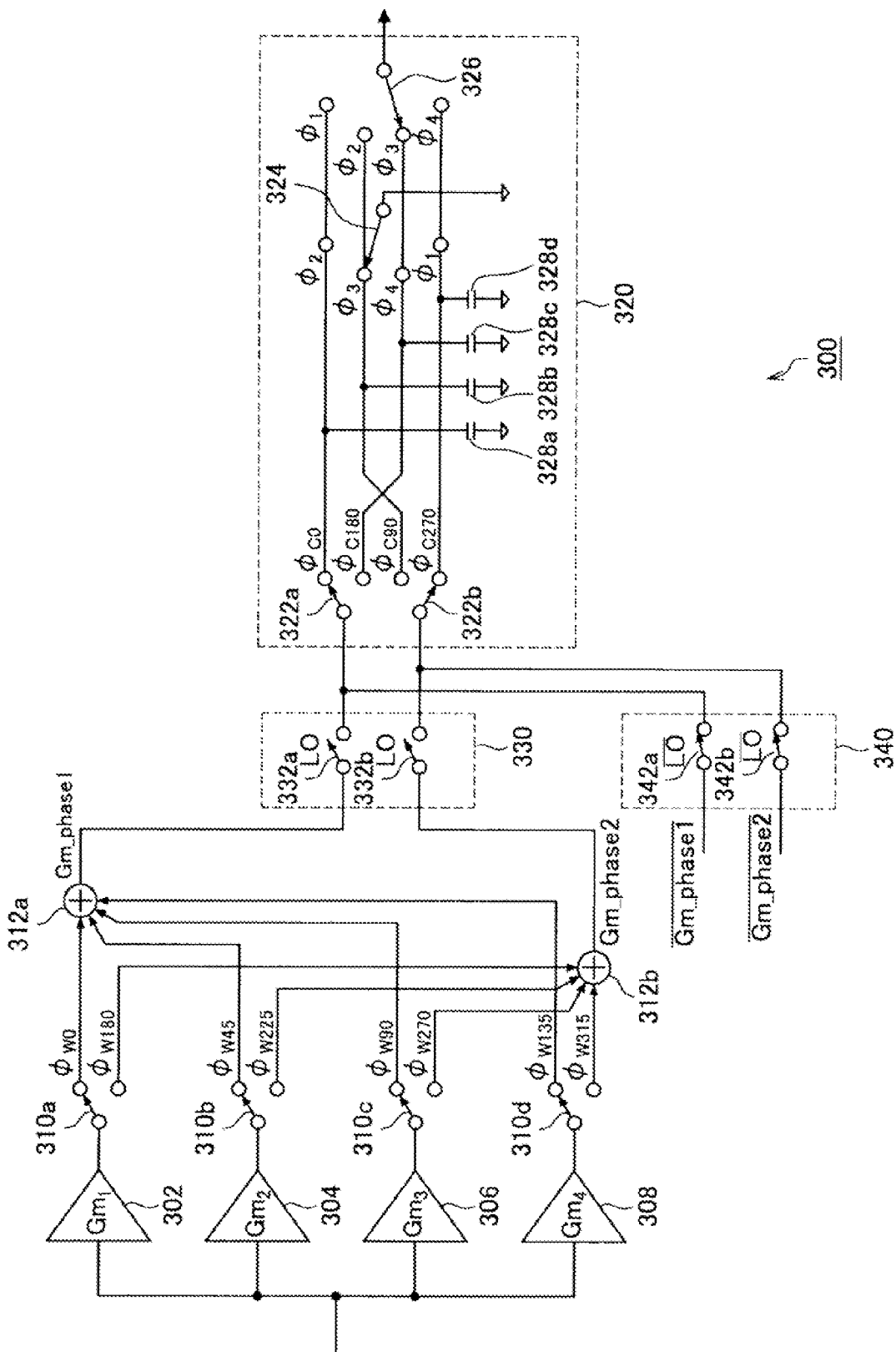
FIG. 16 shows the charge domain filter circuit achieved in the third embodiment of the present invention.
Figure 17:
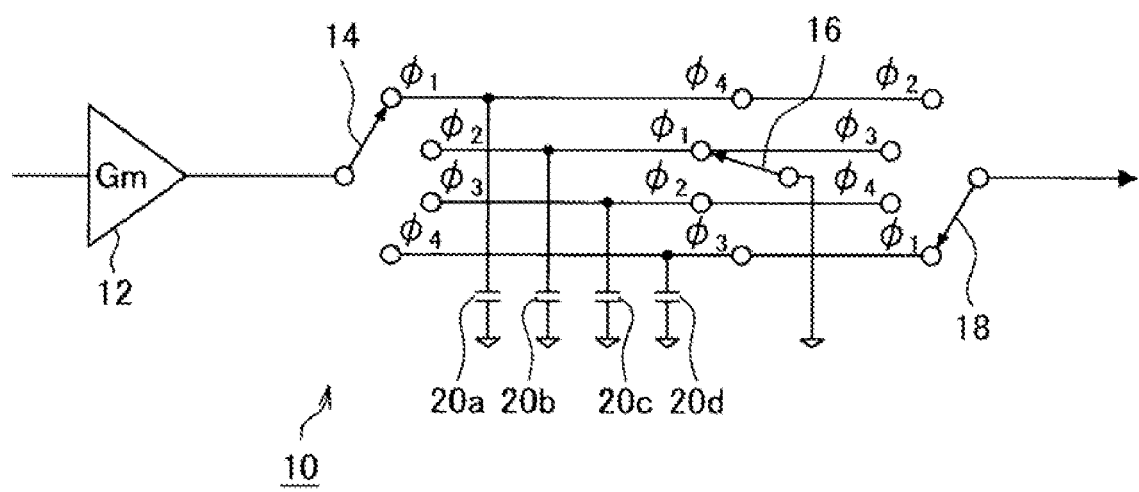
FIG. 17 shows the structure adopted in a charge domain filter circuits forming a SINC filter circuit in the related art.
Figure 18:
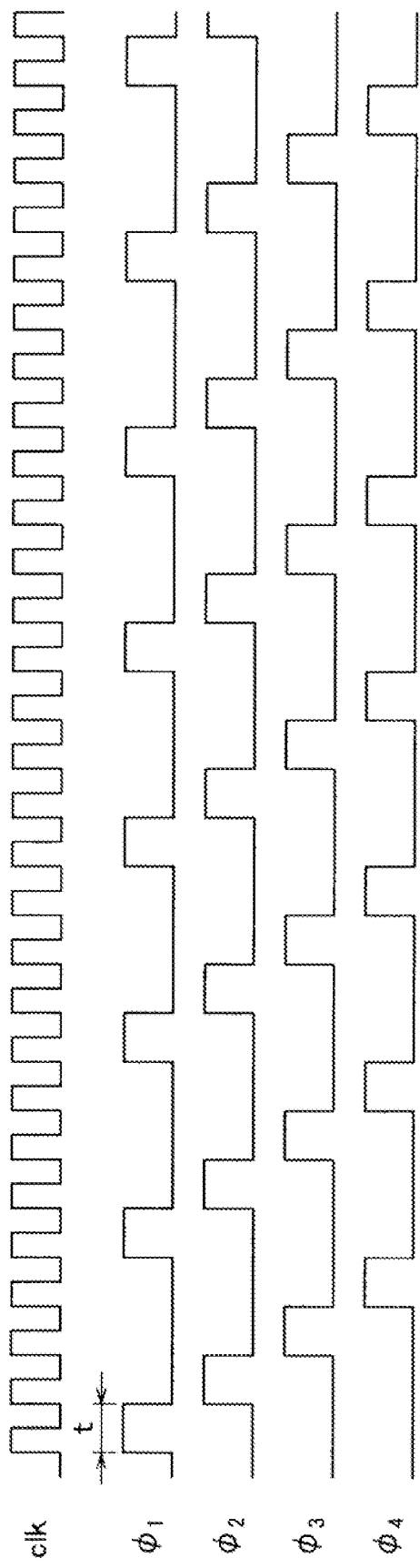
FIG. 18 is a timing chart of clock signals applied to the charge domain filter circuit in the related art.

FIG. 16 shows the charge domain filter circuit achieved in the third embodiment of the present invention. As shown in FIG. 16, the charge domain filter circuit 300 in the third embodiment of the present invention includes transconductors 302, 304, 306 and 308, switches 310a, 310b, 310c and 310d, adders 312a and 312b, a SINC filter circuit 320, a first switch unit 330 and a second switch unit 340.

The SINC filter circuit 32 includes first switches 322a and 322b, a second switch 324, a third switch 326 and capacitors 328a, 328b, 328c and 328d. The first switch unit 330 includes switches 332a and 332b, whereas the second switch unit 340 includes 342a and 342b.

The outputs from the transconductors to the SINC filter circuit 320 are controlled via the first switch unit 330 and the second switch unit 340. More specifically, the outputs from the transconductors are controlled through the first switch unit 330, whereas the outputs assuming phases that are the opposite of the phases in the outputs from the transconductors are controlled through the second switch unit 340.

Clock signals assuming phases that are opposite from each other are input to the first switch unit 330 and the second switch unit 340. Namely, no clock signal input to the second switch unit 340 while a clock signals in the ON state is input to the first switch unit 330, and the clock signal in the ON state is not input to the first switch unit 330 while a clock signal in the ON state is input to the second switch unit 340.

As the clock signals input to the first switch unit 330 and the second switch unit 340 are alternately turned on and off repeatedly, the outputs from the transconductors and outputs assuming phases the opposite of the phases of the outputs from the transconductors are alternately input to the SINC filter circuit 320. Namely, frequency conversion is achieved by multiplying the clock signal input to the first switch unit 330 by the clock signal input to the second switch unit 340. As a result, the charge domain filter circuit 300 functions as a filter circuit achieving filtering characteristics centered on a predetermined frequency.

As explained above, the charge domain filter circuit in the third embodiment of the present invention can be utilized in band pass charge sampling centered on a specific frequency. As in the first embodiment and the second embodiment, the frequency characteristics of the charge domain filter circuit in the third embodiment can be adjusted freely by altering the transconductance value or the capacitor charge time. In other words, by adjusting the transconductance or the capacitor charge time in correspondence to the band of the signal to be passed through or specific purposes of use, a singe circuit can be utilized to pass signals in varying bands, which, turn, makes it possible to subscribe to a plurality of wireless communication services without having to increase the circuit scale.

It should be understood by those skilled in the art that various modification, combinations, sub-combinations and alterations may occur depending on design requirements and other factors insofar as they are within the scope of the appended claims or the equivalents thereof.

What is claimed is:

1. A charge domain filter device, comprising:
a plurality of transconductors, each of which converts an input voltage to an output current, wherein the plurality of transconductors provide output signals which are selectively summed to provide a summed output signal;
a filter unit, including a plurality of capacitors, that filters the summed output signal by repeatedly charging and discharging the plurality of capacitors,
wherein the charge domain filter device has an impulse response obtained through a convolution of a first impulse, corresponding to a charge time length of the capacitors, and a second impulse, corresponding to each of the plurality of transconductors.

2. The charge domain filter device according to claim 1, wherein:
a transconductance at the plurality of transconductors can be varied.

3. The charge domain filter device according to claim 1, wherein:

the charge time length can be varied.

4. The charge domain filter device according to claim 1, wherein:
   a signal obtained through the convolution of the first impulse with the second impulse is input to the filter unit.

5. The charge domain filter device according to claim 4, wherein:
   the convolution is achieved by summing the output currents sliced out with a plurality of rectangular windows in different phases.

6. The charge domain filter device according to claim 1, wherein:
   the convolution is achieved by summing charges stored at the capacitors, sampled at different phases by the filter unit.

7. The charge domain filter device according to claim 1, further comprising:
   a switch unit disposed between the plurality of transconductors and the filter unit.

* * * * *